(12) United States Patent
Ooishi et al.

(10) Patent No.: US 6,778,445 B2
(45) Date of Patent: Aug. 17, 2004

(54) PIPELINE NONVOLATILE MEMORY DEVICE WITH MULTI-BIT PARALLEL READ AND WRITE SUITABLE FOR CACHE MEMORY.

(75) Inventors: Tsukasa Ooishi, Hyogo (JP); Hiroaki Tanizaki, Hyogo (JP)

(73) Assignees: Renesas Technology Corp., Tokyo (JP); Mitsubishi Electric Engineering Company Limited, Tokyo (JP)

( * ) Notice: Subject to any disclaimer, the term of this patent is extended or adjusted under 35 U.S.C. 154(b) by 0 days.

(21) Appl. No.: 10/353,913

(22) Filed: Jan. 30, 2003

(65) Prior Publication Data

US 2004/0027908 A1 Feb. 12, 2004

(30) Foreign Application Priority Data

Aug. 9, 2002 (JP) .................................... 2002-233331

(51) Int. Cl.[7] ............................................. G11C 7/10
(52) U.S. Cl. .................. 365/189.05; 365/220; 365/173; 365/158; 365/230.03; 365/230.07; 365/210; 365/209; 365/230.08; 365/233; 365/163; 365/225.7
(58) Field of Search ............................ 365/163, 225.7, 365/225.6, 220, 189.05, 173, 171, 158, 148, 230.03, 230.06, 230.07, 210, 209, 207, 230.08, 233

(56) References Cited

U.S. PATENT DOCUMENTS 6,191,973 B1  2/2001  Moyer ......................... 365/173
6,625,054 B2 *  9/2003  Lowrey et al. ............... 365/148
6,673,691 B2 *  1/2004  Zhuang et al. ............... 438/382
6,700,813 B2 *  3/2004  Inui ............................. 365/158

FOREIGN PATENT DOCUMENTS

JP    2002-008367    1/2002    ........... G11C/11/14

OTHER PUBLICATIONS

Scheuerlein et al., "A 10ns Read and Write Non–Volatile Memory Array Using a Magnetic Tunnel Junction and FET Switch in Each Cell", ISSCC Digest of Technical Papers, TA7.2, Feb. 2000, pp. 94, 95, 128–129, 409–410.

Durlam et al., "Nonvolatile RAM based on Magnetic Tunnel Junction Elements", ISSCC Digest of Technical Papers, TA7.6, Feb. 2000, pp. 96–97, 130–131, 410–411.

Naji et al., "A 256kb 3.0V 1T1MTJ Nonvolatile Magnetoresistive RAM", ISSCC Digest of Technical Papers, TA7.6, Feb. 2001, pp. 94–95, 122–123, 404–405, 438.

"Forefront of Non–Volatile Memory/The Future in Intel's Mind: From Flash Memory to OUM," Nikkei Microdevices, Mar. 2002, pp. 65–78.

* cited by examiner

*Primary Examiner*—Andrew Q. Tran
(74) *Attorney, Agent, or Firm*—Burns, Doane, Swecker & Mathis, L.L.P.

(57) ABSTRACT

Peripheral circuitry writes/reads input data and output data of L bits (L: integer of at least 2) that is input/output to/from a data node into/from first and second memory cell blocks that are selectively accessed. The peripheral circuitry uses circuit components operating in response to a clock signal to write/read the data by dividing the data writing operation/ data reading operation into a plurality of stages and carrying out them in pipelining manner.

17 Claims, 14 Drawing Sheets

ROW DIRECTION
COLUMN DIRECTION

PIPELINE NONVOLATILE MEMORY DEVICE WITH MULTI-BIT PARALLEL READ AND WRITE SUITABLE FOR CACHE MEMORY.

BACKGROUND OF THE INVENTION

1. Field of the Invention

The present invention relates to nonvolatile memory devices. In particular, the present invention relates to a nonvolatile memory device having memory cells with the electric resistance varied according to the level of storage data written by a data write current.

2. Description of the Background Art

An MRAM (Magnetic Random Access Memory) device is now the focus of attention as a new-generation nonvolatile memory device. The MRAM device uses a plurality of thin-film magnetic elements formed in a semiconductor integrated circuit to store data in nonvolatile manner, with each of the thin-film magnetic elements being randomly accessible.

In recent years, it has been published that memory cells of thin-film magnetic elements with magnetic tunnel junctions are used to achieve dramatic improvements in performance of the MRAM device. The MRAM device including memory cells with magnetic tunnel junctions is disclosed for example in technical papers: "A 10 ns Read and Write Non-Volatile Memory Array Using a Magnetic Tunnel Junction and FET Switch in each Cell," ISSCC Digest of Technical Papers, TA7.2, February 2000, "Nonvolatile RAM based on Magnetic Tunnel Junction Elements," ISSCC Digest of Technical Papers, TA7.3, February 2000 and "A 256 kb 3.0V 1T1MTJ Nonvolatile Magnetoresistive RAM," ISSCC Digest of Technical Papers, TA7.6, February 2001.

FIG. 14 schematically shows a structure of a memory cell having a magnetic tunnel junction (this memory cell is hereinafter referred to as "MTJ memory cell").

Referring to FIG. 14, the MTJ memory cell includes a tunneling magneto-resistance element TMR having an electric resistance varying according to the data level of magnetically written storage data and includes an access transistor ATR. The access transistor ATR is connected in series with the tunneling magneto-resistance element TMR between a bit line BL and a source voltage line SL. The access transistor ATR is typically a field-effect transistor formed on a semiconductor substrate.

To the MTJ memory cell, the bit line BL and a write digit line WDL for allowing respective data write currents to flow in different directions respectively in data writing, a word line WL for reading data, and the source voltage line SL for pulling down the tunneling magneto-resistance element TMR to a ground voltage GND in data reading are provided. In data reading, the access transistor ATR is turned on and, in response to this turn-on, the tunneling magneto-resistance element TMR is electrically coupled between the source line SL and the bit line BL.

FIG. 15 conceptually shows an operation of writing data into the MTJ memory cell.

Referring to FIG. 15, the tunneling magneto-resistance element TMR includes a ferromagnetic layer FL having a fixed direction of magnetization (hereinafter referred to as "fixed magnetic layer"), and a ferromagnetic layer VL magnetized in a direction according to an externally applied magnetic field (hereinafter referred to as "free magnetic layer"). Between the fixed magnetic layer FL and the free magnetic layer VL, a tunneling barrier (tunneling film) TB formed of an insulating film is provided. According to the level of storage data to be written, the free magnetic layer VL is magnetized in the same direction as or in a different direction from the direction in which the fixed magnetic layer FL is magnetized. The fixed magnetic layer FL, tunneling barrier TB and free magnetic layer VL constitute a magnetic tunnel junction.

The tunneling magneto-resistance element TMR has an electric resistance varying according to a relative relation between respective directions of magnetization of the fixed magnetic layer FL and the free magnetic layer VL. Specifically, the tunneling magneto-resistance element TMR has a minimum electric resistance Rmin when the fixed magnetic layer FL has a magnetization direction which is the same as (in parallel with) that of the free magnetic layer VL and has a maximum electric resistance Rmax when respective magnetization directions of the fixed magnetic layer FL and the free magnetic layer VL are opposite to (in antiparallel with) each other.

In data writing, the word line WL is inactivated to turn off the access transistor ATR. In this state, a data write current for magnetizing the free magnetic layer VL flows through each of the bit line BL and the write digit line WDL in respective directions according to the level of data to be written.

FIG. 16 conceptually shows a relation between the data write current and the magnetization direction of the tunneling magneto-resistance element in data writing.

Referring to FIG. 16, the horizontal axis H (EA) represents a magnetic field applied in the direction of an easy axis (EA) in the free magnetic layer VL in the tunneling magneto-resistance element TMR. The vertical axis H (HA) represents a magnetic field acting in the direction of a hard axis (HA) in the free magnetic layer VL. The magnetic field H (EA) and the magnetic field H (HA) correspond respectively to two magnetic fields generated by respective currents flowing through the bit line BL and the write digit line WDL.

In the MTJ memory cell, the fixed magnetization direction of the fixed magnetic layer FL is in parallel with the easy axis of the free magnetic layer VL, and the free magnetic layer VL is magnetized in the direction which is in parallel or antiparallel with (opposite to) the fixed magnetic layer FL in the direction of the easy axis according to the level ("1" or "0") of the storage data. The MTJ memory cell is capable of storing 1-bit data ("1" or "0") according to the two magnetization directions of the free magnetic layer VL.

The magnetization direction of the free magnetic layer VL is only rewritable when the sum of the applied magnetic fields H (EA) and H (HA) falls within the region outside the asteroid characteristic line shown in FIG. 16. In other words, if the intensity of the applied data write magnetic fields corresponds to the region inside the asteroid characteristic line, the magnetization direction of the free magnetic layer VL is not switched.

As indicated by the asteroid characteristic line, a magnetic field in the direction of the hard axis can be applied to the free magnetic layer VL to reduce a magnetization threshold which is necessary for changing the magnetization direction along the easy axis. Suppose that operating points for data writing are designed as shown in FIG. 16. Then, for the MTJ memory cell into which data is to be written, a data write magnetic field in the direction of the easy axis is designed to have its intensity equal to $H_{WR}$. More specifically, the value of a data write current flowing through the bit line BL or the write digit line WDL is designed to obtain this data write magnetic field $H_{WR}$. In general, the data write magnetic field $H_{WR}$ is represented by the sum of a switching magnetic field $H_{SW}$ necessary for changing the magnetization direction and a margin $\Delta H$: $H_{WR}=H_{SW}+\Delta H$.

In order to rewrite storage data of the MTJ memory cell, i.e., switch the magnetization direction of the tunneling magneto-resistance element TMR, a data write current of at least a predetermined level must be flown through both of the write digit line WDL and the bit line BL. Accordingly, the free magnetic layer VL in the tunneling magneto-resistance element TMR is magnetized in the direction in parallel with or opposite to (antiparallel with) the fixed magnetic layer FL according to the direction of a data write magnetic field along the easy axis (EA). The magnetization direction once written into the tunneling magneto-resistance element TMR, i.e., storage data in the MTJ memory cell, is held in nonvolatile manner until execution of writing of new data.

FIG. 17 conceptually shows an operation of reading data from the MTJ memory cell.

Referring to FIG. 17, in the data reading operation, the access transistor ATR is turned on in response to activation of the word line WL. Then, the tunneling magneto-resistance element TMR pulled down to the ground voltage GND is electrically coupled to the bit line BL.

In this state, the bit line BL is pulled up to a predetermined voltage to allow a memory cell current Icell to flow through a current path including the bit line BL and the tunneling magneto-resistance element TMR, according to an electric resistance of the tunneling magneto-resistance element TMR, i.e., the level of storage data in the MTJ memory cell. For example, the memory cell current Icell can be compared with a predetermined reference current to read the storage data from the MTJ memory cell.

In data reading, a data read current Is flows through the tunneling magneto-resistance element TMR. The data read current Is is generally designed to be smaller than the above-discussed data write current by an order or two orders of magnitude. Therefore, there is a low possibility that storage data in the MTJ memory cell is erroneously rewritten because of the influence of the data read current Is in data reading. In other words, data can be read nondestructively.

FIG. 18 shows a structure of the MTJ memory cell formed on a semiconductor substrate.

Referring to FIG. 18, the access transistor ATR formed on the semiconductor main substrate SUB includes n-type impurity regions 310 and 320 and a gate 330. Impurity region 310 is electrically coupled to the source voltage line SL via a metal film formed in a contact hole 341.

The write digit line WDL is formed in a metal interconnect layer provided above the layer of the source voltage line SL. The tunneling magneto-resistance element TMR is electrically coupled to impurity region 320 of the access transistor ATR via a strap 350 and a metal film formed in a contact hole 340. Strap 350 formed of a conductive material is provided for electrically coupling the tunneling magneto-resistance element TMR to the access transistor ATR. The bit line BL is electrically coupled to the tunneling magneto-resistance element TMR and provided above the layer of the tunneling magneto-resistance element TMR.

The bit line BL through which the data write current and the data read current flow and the write digit line WDL through which the data write current flows are formed by using metal interconnect layers. It is unnecessary to force current to flow through the word line WL since the word line WL is provided for controlling the gate voltage of the access transistor ATR. Then, in terms of improvement in the degree of integration, the word line WL is generally formed in the same interconnect layer as gate 330 by using a polysilicon or polycide layer for example, without newly providing a separate metal interconnect layer.

The MRAM device as discussed above is capable of storing data in nonvolatile manner using MTJ memory cells integrated on the semiconductor substrate. Specifically, in each of the MTJ memory cells, the tunneling magneto-resistance element TMR has its electric resistance varied according to the magnetization direction which is rewritable by the data write magnetic field, and thus nonvolatile data storage is possible by correlating the electric resistances Rmax and Rmin of the tunneling magneto-resistance element TMR with respective levels ("1" and "0") of storage data.

A nonvolatile memory cell of a different type drawing attention now is OUM (Ovonic Unified Memories) cell. An overview of OUM is disclosed for example in "Forefront of Non-Volatile Memory/The Future in Intel's Mind: From Flash Memory to OUM," Nikkei Microdevices, March, 2002, pp. 65–78. The OUM cell is constituted of a thin-film chalcogenide layer and a heating element. The chalcogenide is converted into amorphous or chalcogenide depending on heating pattern by the heating element through which a data write current flows. The chalcogenide layer in the amorphous state has its electric resistance different from that in the crystalline state. Accordingly, two patterns of supplying the data write current that correspond respectively to two heating patterns, with the one for converting chalcogenide into amorphous and the other for converting chalcogenide into crystal are set in advance according to the level of write data so as to allow the OUM cell to store data in nonvolatile manner.

As heretofore discussed, characteristics common to the MTJ memory cell and the OUM cell are that current is supplied for writing data into the MTJ memory cell and the OUM cell and that the electric resistance varies according to storage data.

One of chief applications of the memory device is cache memory which is required to perform fast parallel input/output of multibit data. Under the current state of the art, such a cache memory uses SRAM (Static Random Access Memory) cells having, as a basic structure, CMOS (Complementary Metal Oxide Semiconductor) structure with cross-coupled latch. The SRAM cells, however, have a problem that the area of one memory cell is large or the SRAM cells are volatile memories losing data by stopping the power supply, and thus use of the SRAM cell is not necessarily convenient.

On the over hand, EEPROM (Electrically Erasable/Programmable Read-Only Memory) and so-called flash memory that are nonvolatile memory devices and generally used now require relatively long time for writing data (programming), and thus it is difficult to apply these memories to the cache memory.

The MTJ memory cells and OUM cells are new-type nonvolatile memories as described above and desirably constitute a cache memory capable of operating at a high rate. In order to apply the MTJ cells and OUM cells to the cache memory, however, parallel reading and writing operation of multibit data in consideration of the cell characteristics are necessary.

SUMMARY OF THE INVENTION

One object of the present invention is to provide peripheral circuitry of a nonvolatile memory device having memory cells such as MTJ and OUM cells with electric resistance varying in nonvolatile manner according to the level of storage data written by a data write current, the peripheral circuitry suitable for fast parallel input/output of multibit data.

A nonvolatile memory device according to one aspect of the present invention includes a plurality of memory cell blocks that are selectively accessed, the memory cell blocks each including a plurality of memory cells arranged in a matrix and each having an electric resistance varying according to storage data written in nonvolatile manner by a data write current and a plurality of bit lines respectively provided correspondingly to memory cell columns. The nonvolatile memory device further includes a plurality of row selection circuits respectively provided correspondingly to the memory cell blocks, the row selection circuits each selecting memory cell rows in a corresponding memory cell block, and peripheral circuitry for writing and reading data of multiple bits in parallel, the data being input/output to/from a data node, into and from at least a part of memory cells in the selected memory cell row, through at least a part of the bit lines in a selected memory cell block which is one of the memory cell blocks. The peripheral circuitry transmits the data of multiple bits in the direction of the memory cells columns.

Accordingly, one chief advantage of the present invention is that, in the nonvolatile memory device, input/output data of multiple bits is efficiently transmitted by the peripheral circuitry in the direction of columns (bit lines) to/from a selected memory cell block into/from which data is written/ read according to selected bit lines. The nonvolatile memory device is thus provided that is suitable for cache memory required to input/output data of multiple bits in parallel at a high rate.

A nonvolatile memory device according to another aspect of the present invention includes a plurality of memory cells arranged in a matrix and each having an electric resistance varying according to storage data written in nonvolatile manner by a data write current, an address latch circuit temporarily holding information for selecting memory cell rows and memory cell columns, a plurality of bit lines respectively provided correspondingly to the columns of the memory cells, a row selection circuit selecting a memory cell row according to the information held by the address latch circuit, and peripheral circuitry for writing and reading data of multiple bits in parallel, the data being input/output to/from a data node, into and from selected memory cells which are at least a part of memory cells in the selected memory cell row, through at least apart of the bit lines. The peripheral circuitry includes a data latch circuit temporarily holding the data of multiple bits transmitted between the selected memory cells and the data node, and dividing a data reading operation and a data writing operation each into a plurality of cycles to carry out the cycles in pipelining manner.

The above-described nonvolatile memory device has the peripheral circuitry dividing each of the data reading and writing operations into a plurality of stages and carrying out operations in respective stages in pipelining manner, and thus increase in speed of data reading/writing is achieved. The nonvolatile memory device is accordingly provided that is suitable for cache memory required to input/output data of multiple bits in parallel at a high speed.

A nonvolatile memory device according to still another aspect of the present invention includes a plurality of memory cells arranged in a matrix and each having an electric resistance varying according to storage data written in nonvolatile manner by a data write current, a row selection circuit for selecting memory cell rows, a plurality of bit lines respectively provided correspondingly to the memory cell columns, and peripheral circuitry for writing, through the bit lines, input data of L bits in one data writing operation, L being an integer of at least 2, into L memory cells selected from the memory cells. The peripheral circuitry includes a data latch circuit for temporarily holding the input data of L bits. In that one data writing operation, the peripheral circuitry writes a data unit (L/M) times, the data unit being input data of M bits written in parallel into M memory cells different from each other, carries out unit operation of (L/M) times, in each of the unit operations M bits of said input data of L bits written in parallel into M memory cells, M being a divisor of L and satisfying a relation $2 \leq M \leq L$. The M memory cells in respective unit operations are different from each other.

In such a nonvolatile memory device, even if the input data to be written in one writing operation has a large number of bits, that one writing operation is divided into a plurality of stages each for writing a data unit, in order to reduce the number of bits written in parallel. Accordingly, increase of peak power consumption due to increase of the data write current is prevented. The nonvolatile memory device is accordingly provided that is suitable for cache memory required to input/output data of multiple bits in parallel at a high speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
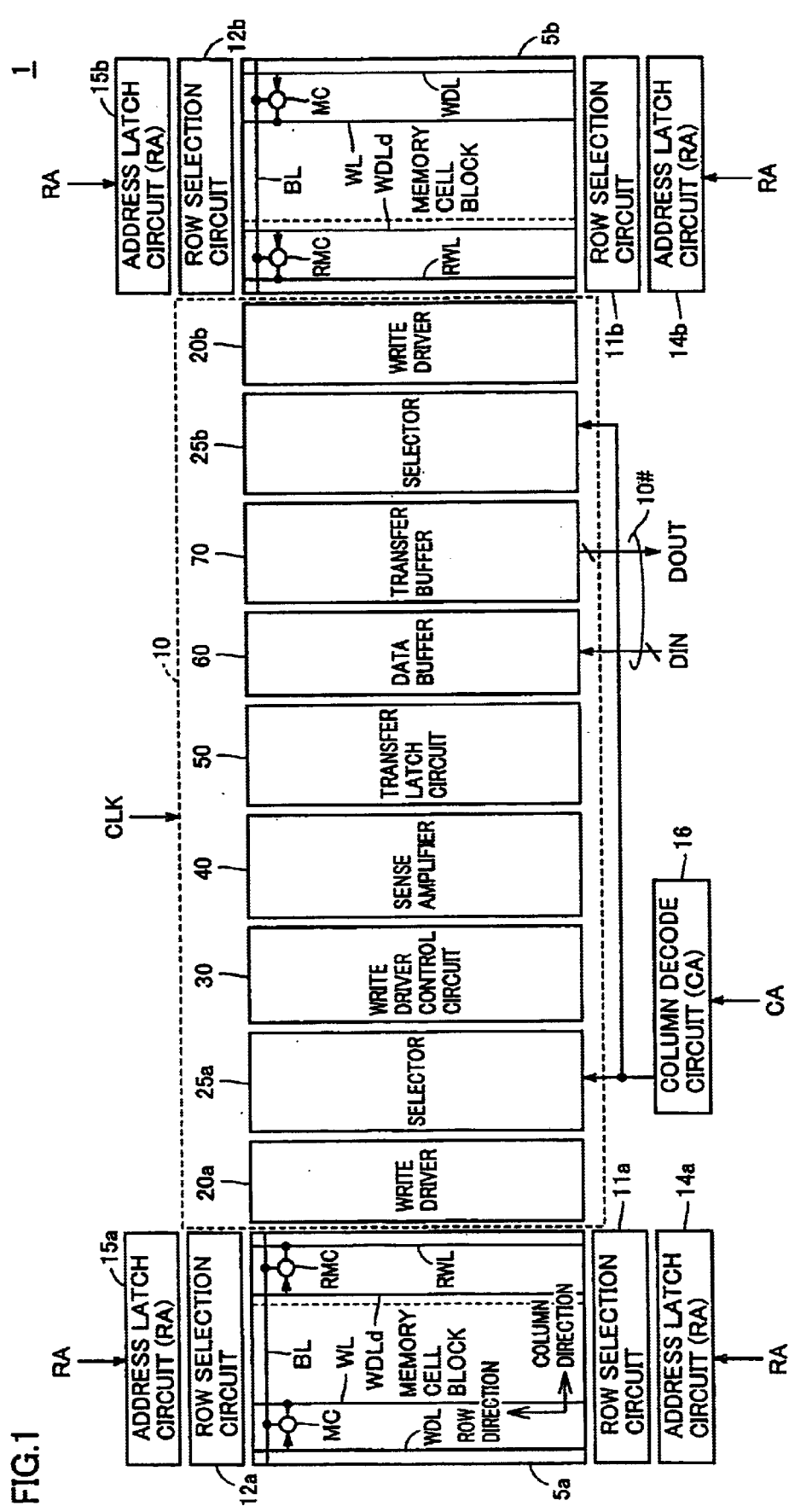
FIG. 1 is a schematic block diagram of an MRAM device showing an entire configuration thereof that is an example of a nonvolatile memory device according to an embodiment of the present invention.

Embodiments of the present invention are now described in detail in connection with the drawings where the same or like components are denoted by the same reference characters.

First Embodiment

FIG. 1 is a schematic block diagram of an MRAM device 1 showing an entire configuration thereof that is an example of a nonvolatile memory device according to this embodiment of the present invention.

It will be seen from the following description that the application of the present invention is not limited to the MRAM device having MTJ memory cells and is applicable commonly to nonvolatile memory devices having memory cells with the electric resistance varied in nonvolatile manner according to the level of storage data written by a data write current.

Referring to FIG. 1, MRAM device 1 includes memory cell blocks 5a and 5b that are selectively accessed, row selection circuits 11a and 12a as well as address latch circuits 14a and 15a provided correspondingly to memory cell block 5a, row selection circuits 11b and 12b as well as address latch circuits 14b and 15b provided correspondingly to memory cell block 5b, and a column decode circuit 16.

Memory cell blocks 5a and 5b each include a plurality of MTJ memory cells MC arranged in rows and columns and reference cells RMC provided for comparison with MTJ memory cells in data reading. Reference cells RMC are arranged to form a reference cell row to share memory cell columns with MTJ memory cells.

Word lines WL and write digit lines WDL are provided correspondingly to respective rows of MTJ memory cells, and bit lines BL are provided correspondingly to respective memory cell columns. Bit line BL is shared by MTJ memory cells and reference cell RMC included in the same memory cell column. For the reference cell row, a reference word line RWL and a dummy write digit line WDLd are provided separately from word lines WL and write digit lines WDL.

Address latch circuits 14a, 14b, 15a and 15b temporarily hold a row address RA. According to the row address latched by address latch circuits 14a and 15a, row selection circuits 11a and 12a select a row in memory cell block 5a. Similarly, row selection circuits 11b and 12b select a row in memory cell block 5b according to the row address latched by address latch circuits 14b and 15b. Alternatively, the result of predecoding or decoding of row address RA may be latched in address latch circuits 14a, 15a, 14b and 15b.

Column decode circuit 16 has a latching function of temporarily holding a column address CA while selecting a column, i.e., bit line, in memory cell blocks 5a and 5b according to the held column address.

MRAM device 1 further includes peripheral circuitry 10 to input/output, to a selected one of memory cell blocks 5a and 5b (hereinafter referred to as "selected memory cell block"), input data DIN/output data DOUT of L bits (L: an integer of at least 2) input/output to/from a data node 10#.

Peripheral circuitry 10 includes a write driver 20a and a selector circuit 25a provided correspondingly to memory cell block 5a, a write driver 20b and a selector circuit 25b provided correspondingly to memory cell block 5b, a write driver control circuit 30, a sense amplifier unit 40, a transfer latch circuit 50, a data buffer 60, and a transfer buffer 70. The circuit components constituting peripheral circuitry 10 each operate in response to a clock signal CLK.

Selector circuits 25a and 25b select at least a part of bit lines BL in respective memory cell blocks 5a and 5b according to column decode circuit 16.

Data buffer 60 temporarily holds input data DIN supplied to data node 10#. Transfer buffer 70 outputs, as output data DOUT, data read from a selected memory cell block to data node 10#.

Peripheral circuitry 10 writes input data DIN and reads output data DOUT into and from at least a part of a plurality of memory cells in a selected memory cell row in a selected memory cell block via bit lines selected by selector circuits 25a and 25b. As seen from the following description, peripheral circuitry 10 transmits input data DIN and output data DOUT between a selected memory cell block and data node 10# in the direction of bit lines, i.e., in the direction along the memory cell columns.

Figure 2:
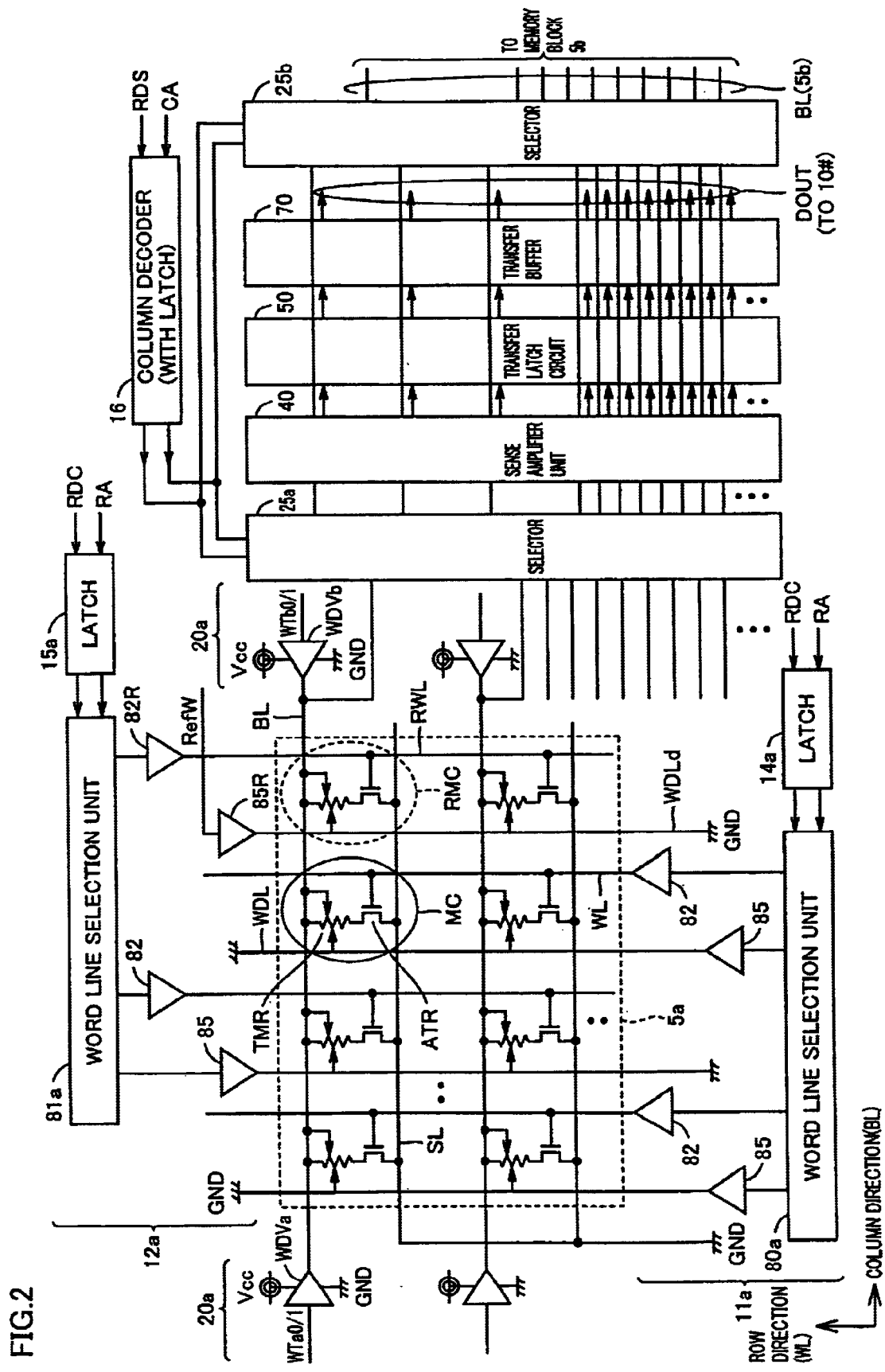
FIG. 2 is a block diagram showing a configuration related to an operation of reading data by the MRAM device shown in FIG. 1.

FIG. 2 is a block diagram showing a configuration related to an operation of reading data by MRAM device 1. FIG. 2 mainly shows circuit components of peripheral circuitry 10 that are related to the data reading operation.

In the following description, it is supposed that memory cell block 5a is a selected memory cell block, however, the configuration and associated data reading operation of memory cell block 5b are similar to those of memory cell block 5a discussed below.

Referring to FIG. 2, in memory cell block 5a, MTJ memory cells MC are arranged in rows and columns. As discussed above, word lines WL and write digit lines WDL are provided correspondingly to respective memory cell rows and bit lines BL and source voltage lines SL are provided correspondingly to respective memory cell columns.

Figure 14:
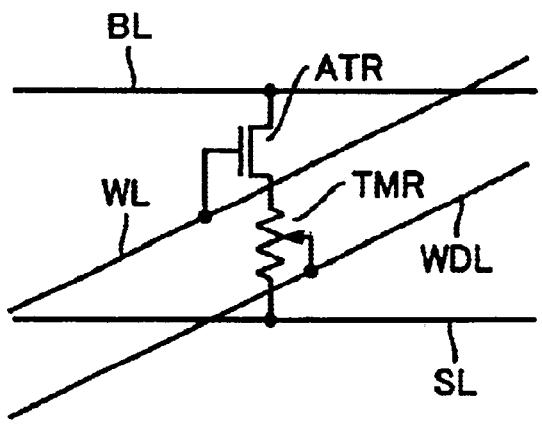
FIG. 14 schematically shows a structure of an MTJ memory cell.

MTJ memory cells each include a tunneling magneto-resistance element TMR and an access transistor ATR having the same structure as described in connection with FIG. 14 and connected in series between a corresponding bit line BL and a corresponding source voltage line SL.

As discussed above, tunneling magneto-resistance element TMR has its electric resistance according to the magnetization direction. Specifically, tunneling magneto-resistance element TMR in each MTJ memory cell is magnetized in a predetermined direction to store data of H level ("1") or data of L level ("0") and the electric resistance thereof is set at Rmax or Rmin.

Each source voltage line SL is coupled to ground voltage GND. The source voltage of each access transistor ATR is thus fixed at ground voltage GND. Then, in a selected row in which a corresponding word line WL is activated to H level, each tunneling magneto-resistance element TMR is pulled down to ground voltage GND and connected to bit line BL.

Memory cell block 5a further includes a plurality of reference cells RMC arranged to constitute a reference row. Reference cells RMC are provided for comparison with selected memory cells in data reading. Reference cells RMC each have the same structure and characteristics as those of MTJ memory cell MC. Therefore, reference cells RMC may be structured by an extra row of MTJ memory cells that are added to MTJ memory cells MC serving as effective bits.

As reference cells RMC have the same structure and shape as those of MTJ memory cells, special design and manufacturing process for producing the reference cells are unnecessary. The reference cells are produced without such a problem of increase in chip area or decrease of process margin of the memory array due to any complicated manufacturing process. In particular, the continuity in terms of the structure within memory cell blocks 5a and 5b is ensured, which contributes to stabilization of manufacturing characteristics of MTJ memory cells MC and reference cells RMC.

Figure 15:
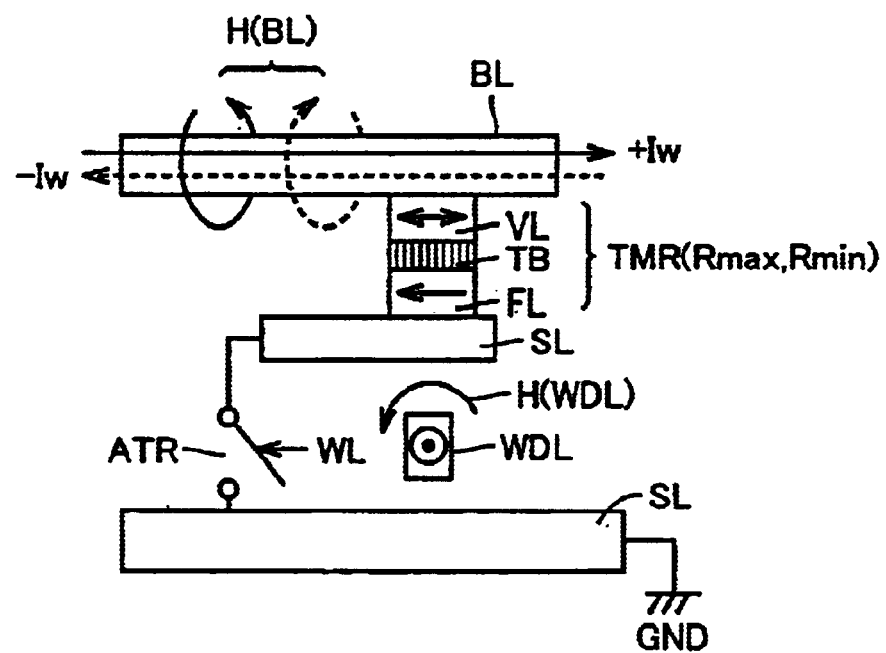
FIG. 15 conceptually shows an operation of writing data into the MTJ memory cell.
Figure 16:
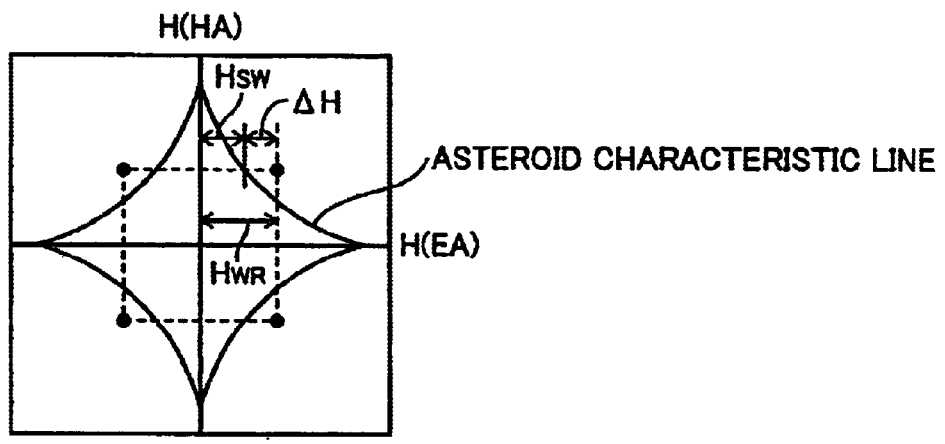
FIG. 16 conceptually shows a relation between a data write current and a magnetization direction of a tunneling magneto-resistance element in data writing.
Figure 17:
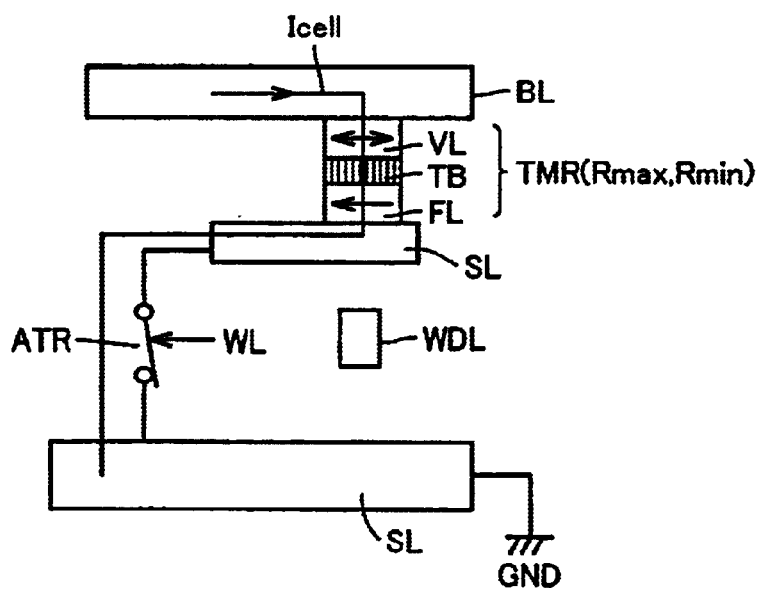
FIG. 17 conceptually shows reading of data from the MTJ memory cell.
Figure 18:
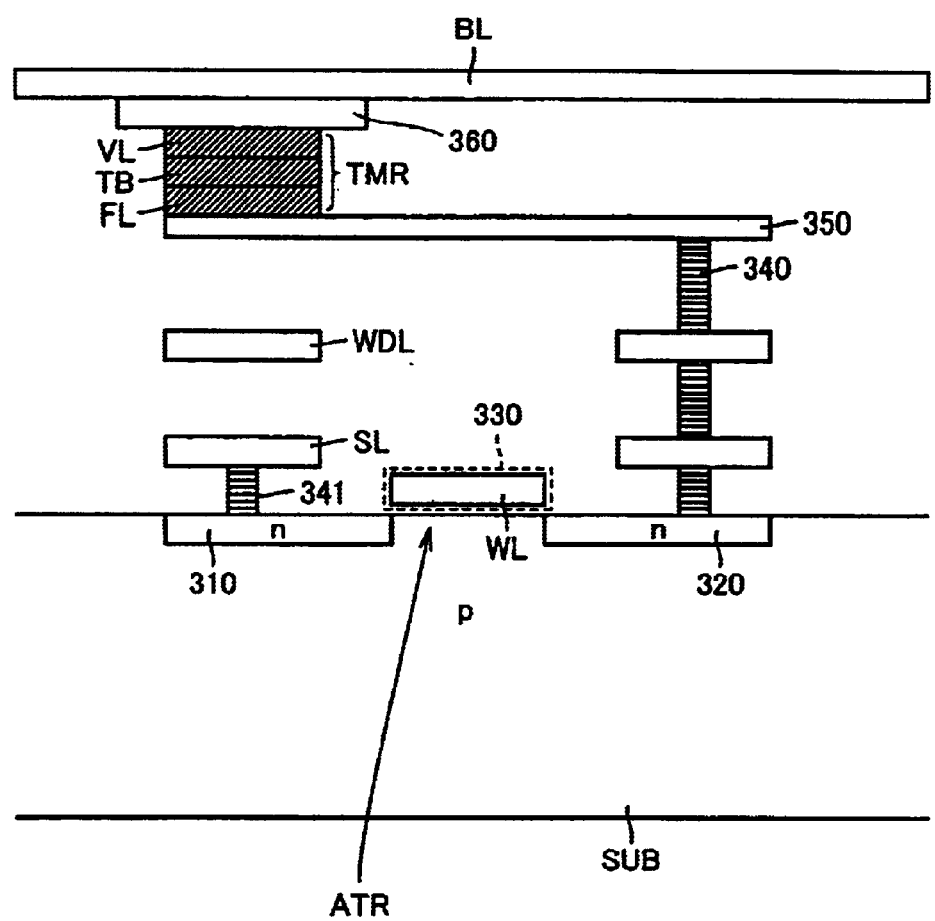
FIG. 18 shows a structure of the MTJ memory cell formed on a semiconductor substrate.

Each reference cell RMC is required to fixedly hold storage data of a predetermined level. Specifically, each reference cell RMC may be magnetized in a direction corresponding to that predetermined level in production and it is unnecessary to write data into the reference cell in a normal operation. In particular, the predetermined level may be correlated with electric resistance Rmin of MTJ memory cell so as to allow the fixed magnetic layer FL and free magnetic layer VL as shown in FIG. 15 for example to be magnetized in the same direction, and accordingly the manufacturing step of magnetization is made efficient. Then, each reference cell RMC described hereinafter is supposed to store a level corresponding to electric resistance Rmin.

Reference cells RMC are arranged to share memory cell columns with MTJ memory cells. As described above, a reference word line RWL and a dummy digit line WDLd are provided correspondingly to the reference cell row.

Reference cells RMC each thus include a tunneling magneto-resistance element TMR and an access transistor ATR connected in series between a corresponding bit line BL and a corresponding source voltage line SL. In each reference cell RMC, the gate of access transistor ATR is connected to reference word line RWL.

Row selection circuit 11a includes word line drivers 82 for odd-numbered rows and a word line selection unit 80a, while row selection circuit 12a includes word line drivers 82 for even-numbered rows, a word line driver 82R related to reference word line RWL and a word line selection unit 81a. In this way, word line drivers 82 are arranged in each row selection unit for every other rows and thus efficient arrangement of circuit components in each of row selection circuits 11a and 11b is possible.

Address latch circuits 14a and 15a each take in and latch a supplied row address RA in response to an activation edge of clock signal CLK having a predetermined cycle. Word line selection unit 80a selectively activates word lines WL of odd-numbered rows according to row address RA latched by address latch circuit 14a. Similarly, word line selection unit 81a selectively activates word lines WL of even-numbered rows according to row address RA latched by address latch circuit 15a. In selected memory cell block 5a as a whole, one of a plurality of word lines WL is activated by word line selection units 80a and 81a.

Figure 3:
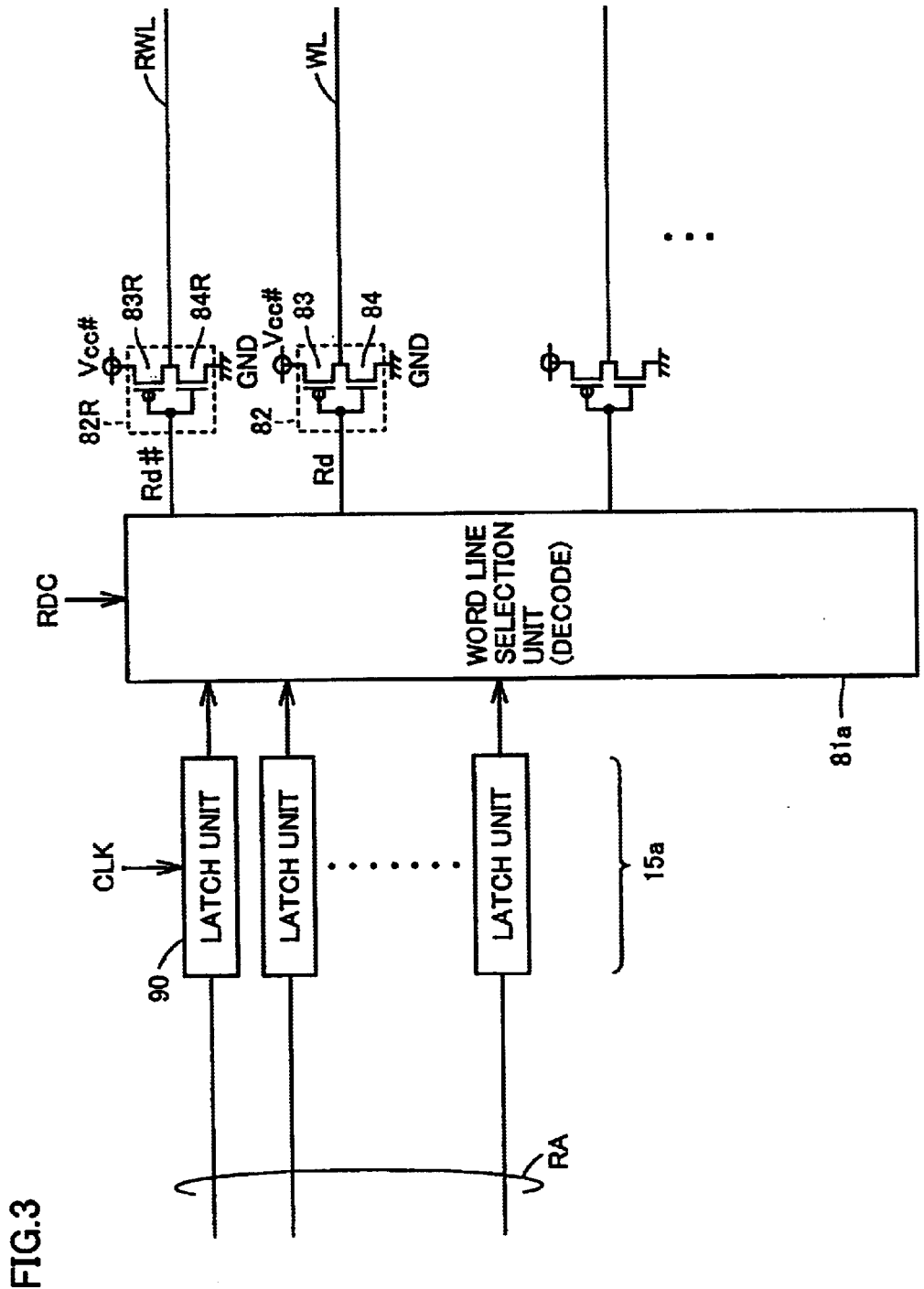
FIG. 3 is a circuit diagram showing circuit components of a row selection circuit that are related to selection of word lines.

FIG. 3 is a circuit diagram showing circuit components of the row selection circuit that are related to selection of word lines.

Referring to FIG. 3, address latch circuit 15a includes a plurality of latch units 90 respectively provided correspondingly to the bits of row address RA. Each latch unit 90 takes in a corresponding bit of row address RA in response to an activation edge of clock signal CLK to temporarily hold that bit. Word line selection unit 81a decodes the bits of row address RA that are held by respective latch units 90 to generate a decode signal Rd# corresponding to the reference cell row and a decode signal Rd corresponding to each memory cell row.

In data reading, decode signal Rd is activated to L level in a selected memory cell row of a selected memory cell block while decode signals Rd in other memory cell rows other than the selected memory cell row are inactivated to H level.

Word line driver 82 includes a P channel MOS transistor 83 connected between a power supply voltage Vcc# and one end of a corresponding word line WL, and an N channel MOS transistor 84 connected between ground voltage GND and that one end of the corresponding word line WL. Transistors 83 and 84 each have the gate receiving a corresponding decode signal Rd. In the selected memory cell row, transistor 83 is turned on while transistor 84 is turned off to connect word line WL to supply voltage Vcc# and activate the word line to H level. In each of other memory cell rows, transistor 84 is turned on and transistor 83 is turned off to connect word line WL to ground voltage GND and inactivate the word line to L level.

Similarly, word line driver 82R includes a P channel MOS transistor 83R connected between supply voltage Vcc# and one end of reference word line RWL, and an N channel MOS transistor 84R connected between ground voltage GND and that one end of reference word line RWL. Transistors 83R and 84R each have the gate receiving decode signal Rd#. Reference word line RWL is connected to supply voltage Vcc# and activated to H level in response to activation (L level) of decode signal Rd#. Activation of reference word line RWL in each of a selected memory cell block and a non-selected memory cell block is controlled as described later in detail. It is noted that address latch circuit 14a, word line selection unit 80a and word line drivers 82 for odd-numbered rows have their structures and functions similar to those of address latch circuit 15a, word line selection unit 81a and word line drivers 82 for even-numbered rows shown in FIG. 3.

Referring again to FIG. 2, MTJ memory cells of a selected memory cell row with a corresponding word line WL activated are electrically coupled respectively to bit lines BL. On the other hand, reference cells RMC are electrically coupled to respective bit lines BL in response to activation of reference word line RWL.

Write digit line drivers 85 are provided correspondingly to write digit lines WDL and bit line drivers WDVa and WDVb are arranged correspondingly to respective ends of bit line BL to constitute a write driver 20a. Details of the structures and operations of these drivers are given later together with details of circuitry associated with a data reading operation.

Sense amplifier unit 40 includes sense amplifiers, the number of the amplifiers being at least the number of bits of output data DOUT in one data reading operation, namely, at least L sense amplifiers. In other words, sense amplifier unit 40 represents at least L sense amplifiers.

Column decode circuit 16 takes in and latches column address CA in response to activation of a read control signal RDS and controls connection by selector circuits 25a and 25b according to the latched column address. Specifically, in one data reading operation, selector circuits 25a and 25b control connection between bit lines BL and sense amplifier unit 40 according to column address CA latched by column decode circuit 16.

In data reading, selector circuit 25a follows an instruction from column decode circuit 16 to connect L bit lines BL in memory cell block 5a to L sense amplifiers. Similarly, selector circuit 25b follows an instruction from column decode circuit 16 to connect L bit lines BL in memory cell block 5b to L sense amplifiers. Accordingly, each of the L sense amplifiers is connected to one of the L bit lines (selected bit lines) in a selected memory cell block and one of the L bit lines in a non-selected memory cell block.

Sense amplifiers pull up bit lines respectively connected thereto with substantially the same driving power. Therefore, on the selected bit lines of the selected memory cell block, a voltage and a current are generated according to the electric resistance (Rmax or Rmin) of selected memory cells based on access to the selected memory cells. On the other hand, on bit lines of the non-selected memory cell block, a voltage and a current are generated according to the electric resistance (Rmin) of the reference cells based on access to the reference cells.

In the following description, the voltage and the current on the selected bit lines of the selected memory cell block are denoted respectively by V (BL) and I (BL) while the voltage and the current on the bit lines of the non-selected memory cell block are denoted respectively by V (BLr) and I (BLr).

Figure 4:
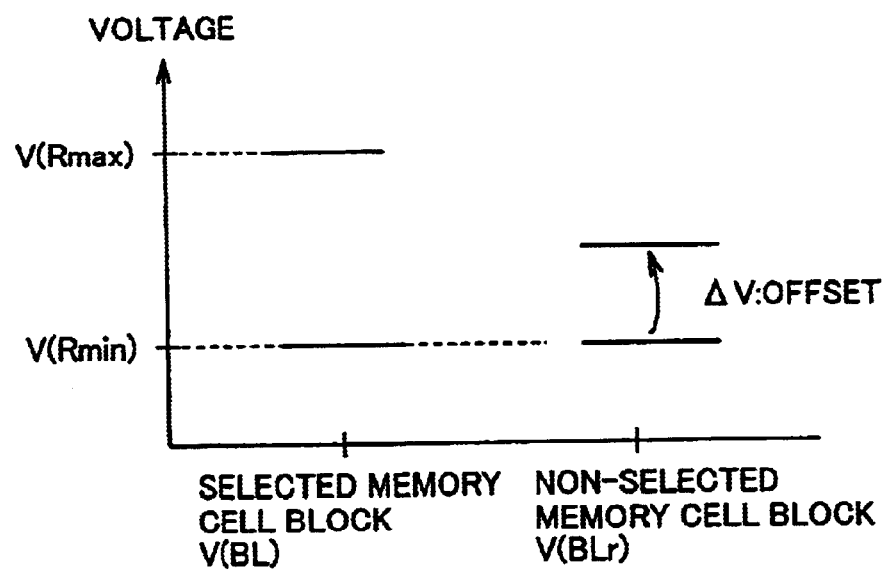
FIG. 4 is a first illustration conceptually showing an amplifying operation by a sense amplifier.
Figure 5:
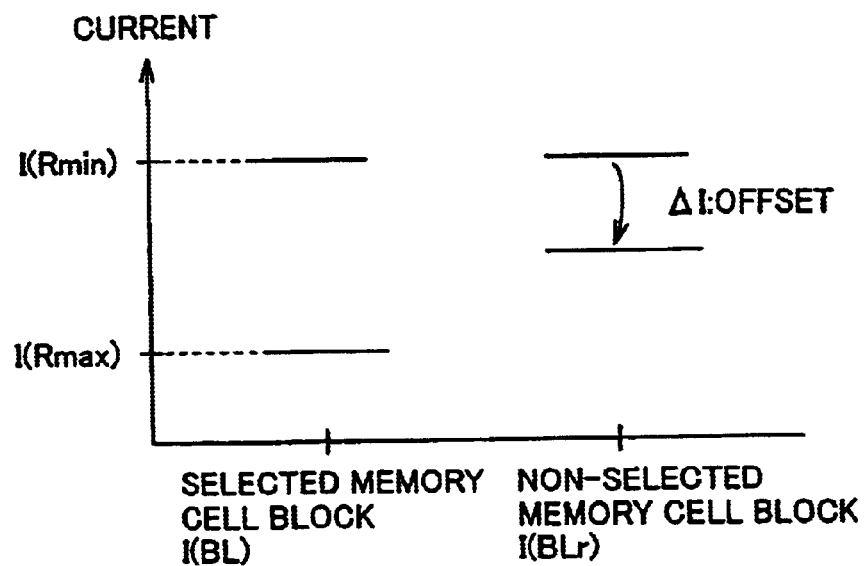
FIG. 5 is a second illustration conceptually showing an amplifying operation by the sense amplifier.

FIGS. 4 and 5 are first and second illustrations conceptually showing the amplifying operation by each sense amplifier.

Referring to FIG. 4, voltage V (BL) on the selected bit line stays at one of V (Rmax) and V (Rmin) according to storage data of the selected memory cell. On the other hand, bit line voltage V (BLr) of the non-selected memory cell block stays at a level substantially equal to that of voltage V (Rmin).

Each sense amplifier is structured to supply a voltage offset ΔV at one input node connected to the bit line of the non-selected memory cell block. Such a structure of the sense amplifier to provide the voltage offset at one input node is generally known and thus specific description thereof is not given here. Voltage offset ΔV is defined to satisfy the following formula (1).

$$V(Rmin)+\Delta V<V(Rmax) \tag{1}$$

Alternatively, current sense amplifiers may be used in sense amplifier unit 40. If the current sense amplifiers are arranged, the offset as shown in FIG. 5 has to be supplied.

Referring to FIG. 5, current I (BL) on the selected bit line stays at one of I (Rmax) and I (Rmin) according to storage data of the selected memory cell. On the other hand, bit line current I (BLr) of the non-selected memory cell block stays at a level substantially equal to that of current I (Rmin).

Each sense amplifier is structured to supply a current offset ΔI at one input node connected to the bit line of the non-selected memory cell block. Such a current offset may be produced by providing a predetermined input impedance difference between input nodes, for example. As this sense amplifier structure is generally known, detailed description of the circuit structure is not provided here.

Current offset ΔI is defined to satisfy the following formula (2).

$$I(Rmin)-\Delta I>I(Rmax) \tag{2}$$

In this way, L sense amplifiers connected respectively to L selected bit lines generate voltage signals according to storage data of L selected memory cells respectively.

Alternatively, sense amplifier unit 40 may be constituted of sense amplifiers with the number thereof being equal to the number of bit lines in each memory cell block to selectively operate L sense amplifiers among all sense amplifiers according to an instruction from column decode circuit 16 as selector circuits 25a and 25b.

Referring again to FIG. 2, read data of L bits read in parallel by L sense amplifiers in sense amplifier unit 40 is latched by transfer latch circuit 50 and transmitted in parallel to transfer buffer 70. Transfer buffer 70 provides output data DOUT of L bits in parallel to data node 10#.

Figure 6:
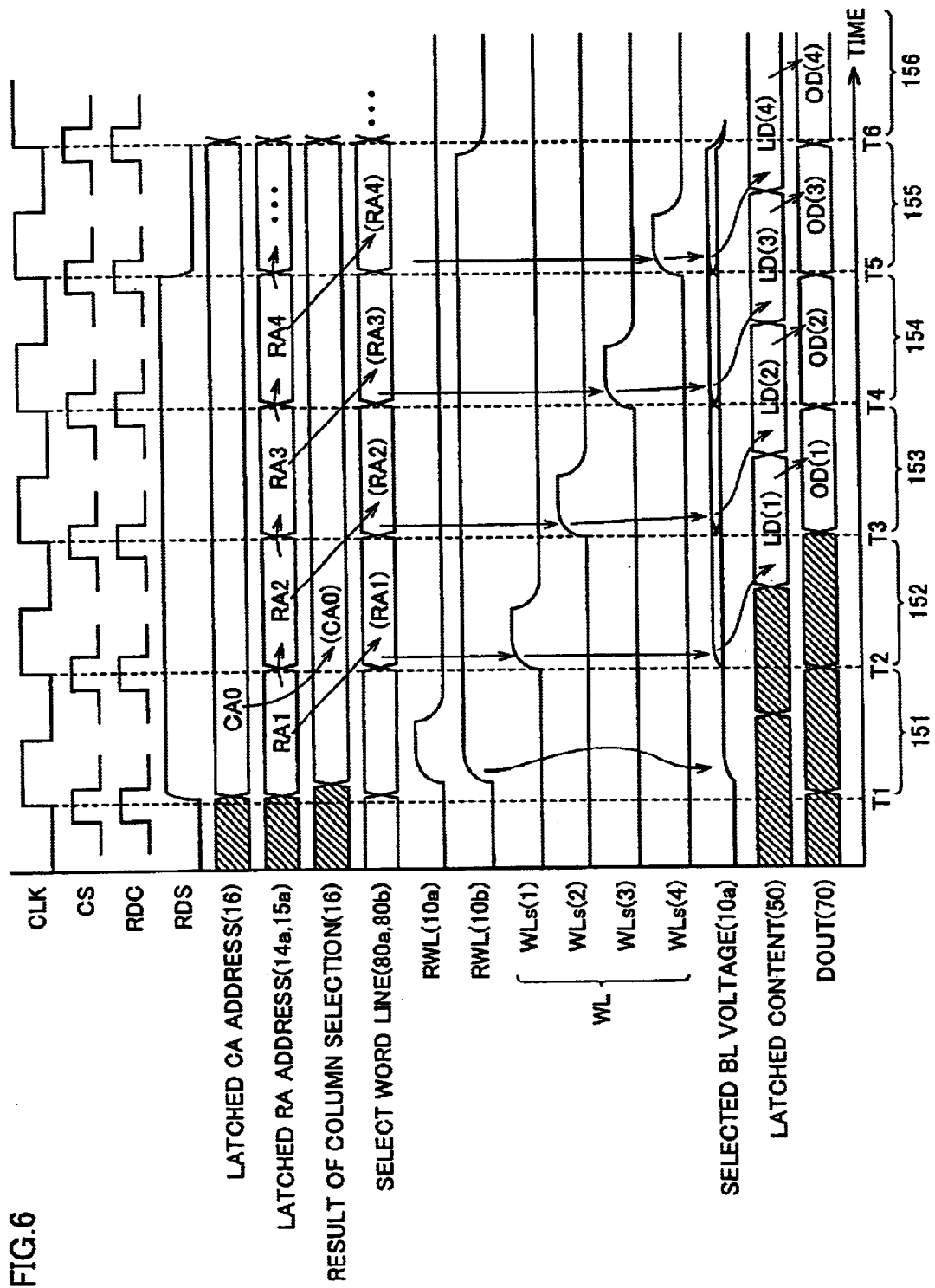
FIG. 6 is an operational waveform chart illustrating an operation of reading data by the MRAM device according to the first embodiment.

FIG. 6 is an operational waveform chart illustrating the data reading operation by the MRAM device according to the first embodiment.

Referring to FIG. 6, H level (active state) and L level (inactive state) of clock signal CLK are repeated at predetermined cycles. Activation edges of clock signal CLK are indicated respectively by time T1–time T6 and corresponding signal cycles are indicated by cycle 151–155, . . . . At time T1, a read command is input to set read control signal RDS to H level and, at time T1–time T4 corresponding to the clock activation edge, read clock RDC is activated to H level.

The data reading operation by peripheral circuitry 10 is divided into a plurality of stages according to the cycles of clock signal CLK and carried out in pipelining manner as discussed below.

At time T1, in response to read clock RDS, row address RA1 and column address CA0 are latched by address latch circuits 14a and 15a and column decode circuit 16.

In cycle 151, according to the latched addresses at time T1, row selection and column selection are performed. Specifically, decoding operation is carried out by word line selection units 80a and 81a and column decode circuit 16.

Following the result of decoding by column decode circuit 16, selector circuits 25a and 25b select, according to column address CA0, L bit lines in selected memory cell block 5a and L bit lines in non-selected memory cell block 5b and connect the L bit lines to L sense amplifiers in sense amplifier unit 40.

Further, reference word line RWL in selected memory cell block 5a and reference word line RWL in non-selected memory cell block 5b are both activated to H level. In response to this, bit lines BL in memory cell blocks 5a and 5b that are precharged to ground voltage GND before the data reading operation are initialized to a predetermined voltage according to the electric resistance (Rmin) of reference cells RMC.

Before time T2 when the next cycle 152 starts, reference word line RWL in selected memory cell block 5a is inactivated while reference word line RWL in non-selected memory cell block 5b is continuously activated. Selection/non-selection of memory cell blocks is determined based on address information latched at time T1.

In the subsequent cycle 152 (from time T2 to time T3), a word line WLs(1) corresponding to row address RA1 latched at time T1 is activated. Consequently, on selected bit lines of selected memory cell block 5a, any voltage (current) is generated according to storage data Rmax or Rmin of selected memory cells. On corresponding bit lines of non-selected block (not shown), the voltage (current) according to the electric resistance (Rmin) of reference cells RMC is maintained. Voltage difference (current difference) between the bit lines is thus amplified to read data of L bits in parallel by sense amplifier unit 40.

The data read by sense amplifier unit 40 is amplified to an effective amplitude in the course of cycle 152. Latch data LD(1) in transfer latch circuit 50 becomes effective from this time.

Figure 10:
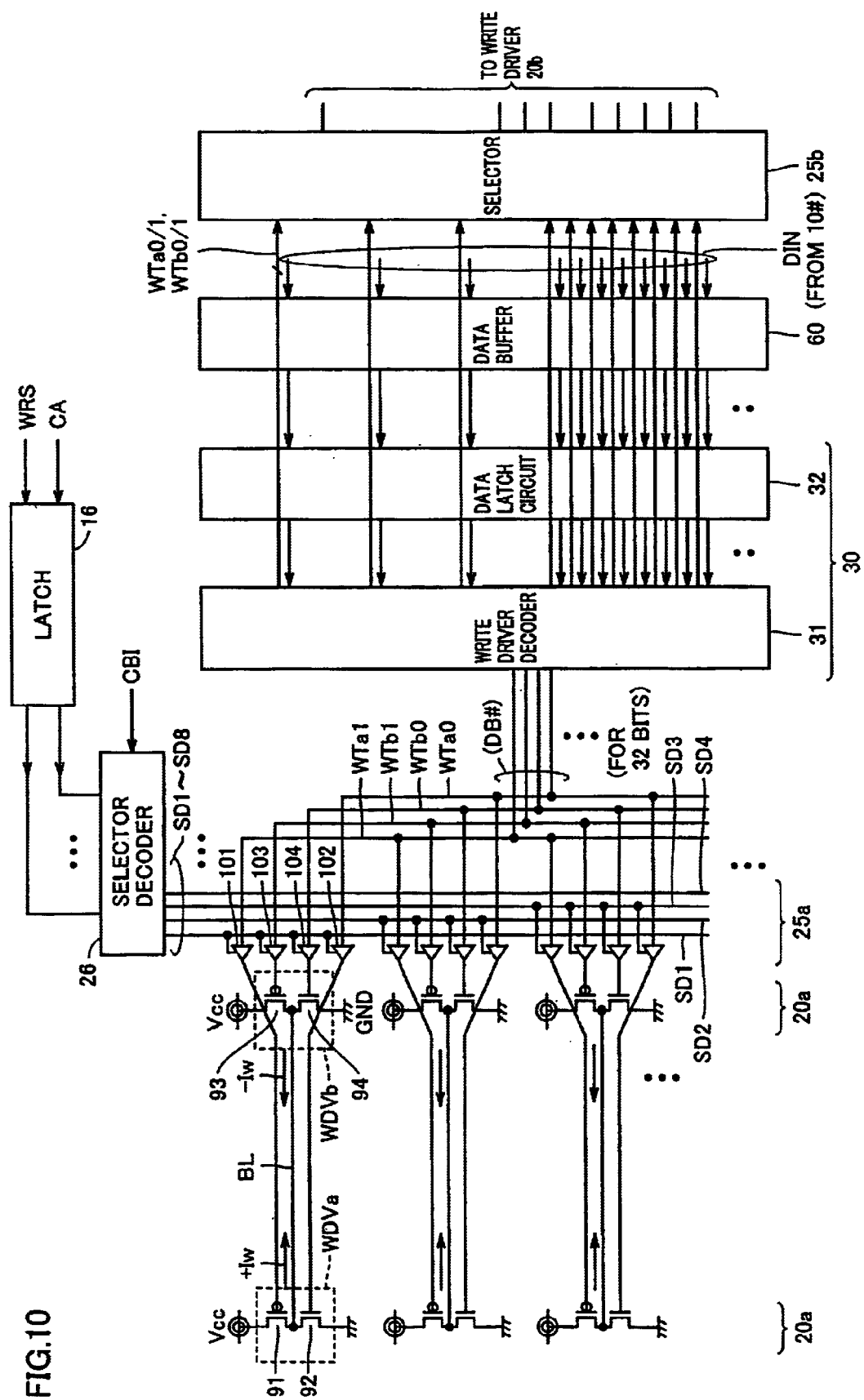
FIG. 10 is a circuit diagram showing details of the configuration related to transmission of the write control signals to the bit line drivers in FIG. 9.

In the data reading operation, column address CA is fixed (CA=CA0). On the other hand, row address RA is updated in each cycle in burst operation manner. FIG. 10 shows initial four burst operations by which data are read according to row addresses RA1–RA4 shown as examples.

At time T2 when cycle 152 starts, row address RA2 is newly latched by address latch circuits 14a and 15a and row selection is carried out according to row address RA2 in cycle 152.

The effective latch data LD(1) latched by transfer latch circuit 50 is transferred to transfer buffer 70 in response to the next activation edge of the clock (time T3). In the subsequent cycle 153 (from time T3 to time T4), transfer buffer 70 outputs read data OD(1) of leading L bits corresponding to row address RA1 and column address CA0.

In this way, the data reading operation is divided into first to third stages corresponding respectively to cycle 151–cycle 153 and carried out in pipelining manner. In the first stage (cycle 151), no array operation is substantially performed while the address information is taken in, latched and decoded and the initial voltage of the bit lines is set. In the second stage (cycle 152), the selected word line is activated to change the bit line voltage (current) according to storage data of selected memory cells and the sense amplifier unit amplifies the voltage (current) difference based on the bit line voltage (current). Further, in the third stage (cycle 153), read data corresponding to the address information taken in the first stage is output.

In cycle 153, in parallel with the operation discussed above in the third stage according to row address RA1, the operation in the second stage is carried out according to row address RA2 and the operation in the first stage is carried out according to row address RA3. In other words, in cycle 153, a word line corresponding to row address RA2 is activated and, at time T3 when cycle 153 starts, row address RA3 is newly latched by address latch circuits 14a and 15a and row selection is performed according to row address RA3 in cycle 153.

In cycle 154 and cycles subsequent thereto, pipelining operation as described above is carried out. Thus, from cycle 154 to cycle 156, word lines WLs(2)–WLs(4) corresponding respectively to row addresses RA2–RA4 are activated and read data OD(2)–OD(4) corresponding respectively to row addresses RA2–RA4 taken in respective cycles 152–154 are output.

As described above, in peripheral circuitry 10, selector circuits 25a and 25b select connection of bit lines to allow the multibit read data to be output efficiently in the direction of columns (bit lines).

As the data reading operation in peripheral circuitry 10 is divided into a plurality of stages and carried out in pipelining manner, fast data reading is achieved by the high frequency process in response to clock signal CLK. In particular, in the first cycle (cycle 151 in FIG. 6) before a selected address is determined, bit lines in the selected and non-selected memory cell blocks that are at the precharge voltage GND are initialized to the level which is close to the voltage level generated when selected memory cells are accessed and then, the selected memory cells are accessed. Therefore, the fast data reading operation is achieved.

A data writing operation and a configuration of circuitry related to the data writing operation are described below.

Figure 7:
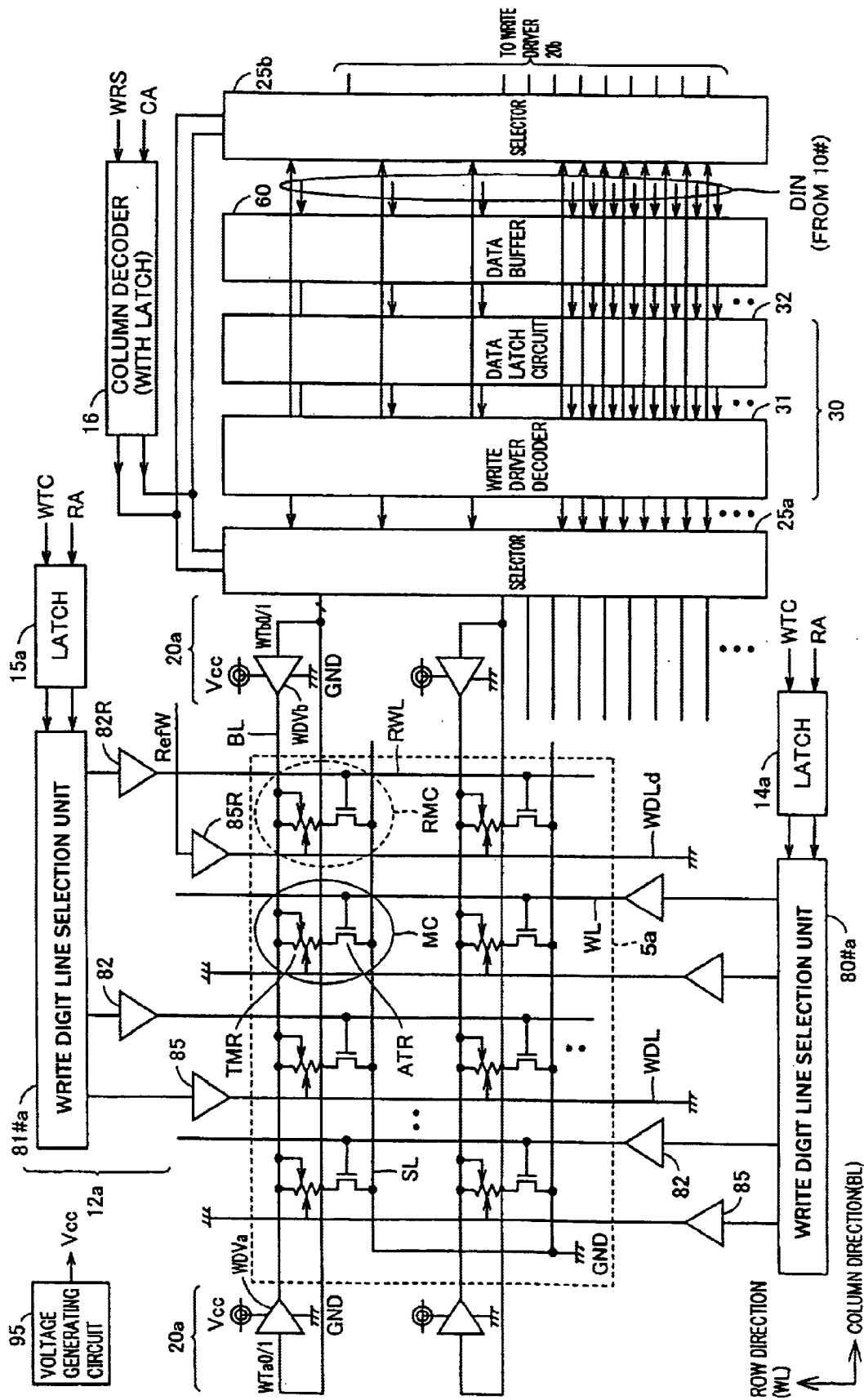
FIG. 7 is a block diagram showing a configuration related to an operation of writing data by the MRAM device shown in FIG. 1.

FIG. 7 is a block diagram showing the configuration related to the operation of writing data by MRAM device 1. FIG. 7 mainly shows circuit components of peripheral circuitry 10 that are related to the data writing operation.

In the following description, it is supposed that memory cell block 5a is a selected memory cell block, however, the configuration and associated data writing operation of memory cell block 5b are similar to those of memory cell block 5a discussed below.

Referring to FIG. 7, write driver 20a includes bit line drivers WDVa and WDVb arranged correspondingly at respective ends of each bit line BL. In each memory cell column, bit line driver WDVa drives, according to write control signals WTa0 and WTa1, the corresponding one end of bit line BL with one of supply voltage Vcc and ground voltage GND. Similarly, bit line driver WDVb drives, according to write control signals WTb0 and WTb1, the corresponding one end of bit line BL with one of supply voltage Vcc and ground voltage GND.

Supply voltage Vcc used by bit line drivers WDVa and WDVb may be set higher than a supply voltage Vcc# of the data reading circuitry in order to supply a sufficient amount of data write current. In this case, supply voltage Vcc# is boosted by a voltage generating circuit 95 to generate supply voltage Vcc used for the data writing circuitry.

In addition, write digit line drivers 85 are provided correspondingly to respective write digit lines WDL.

Figure 8:
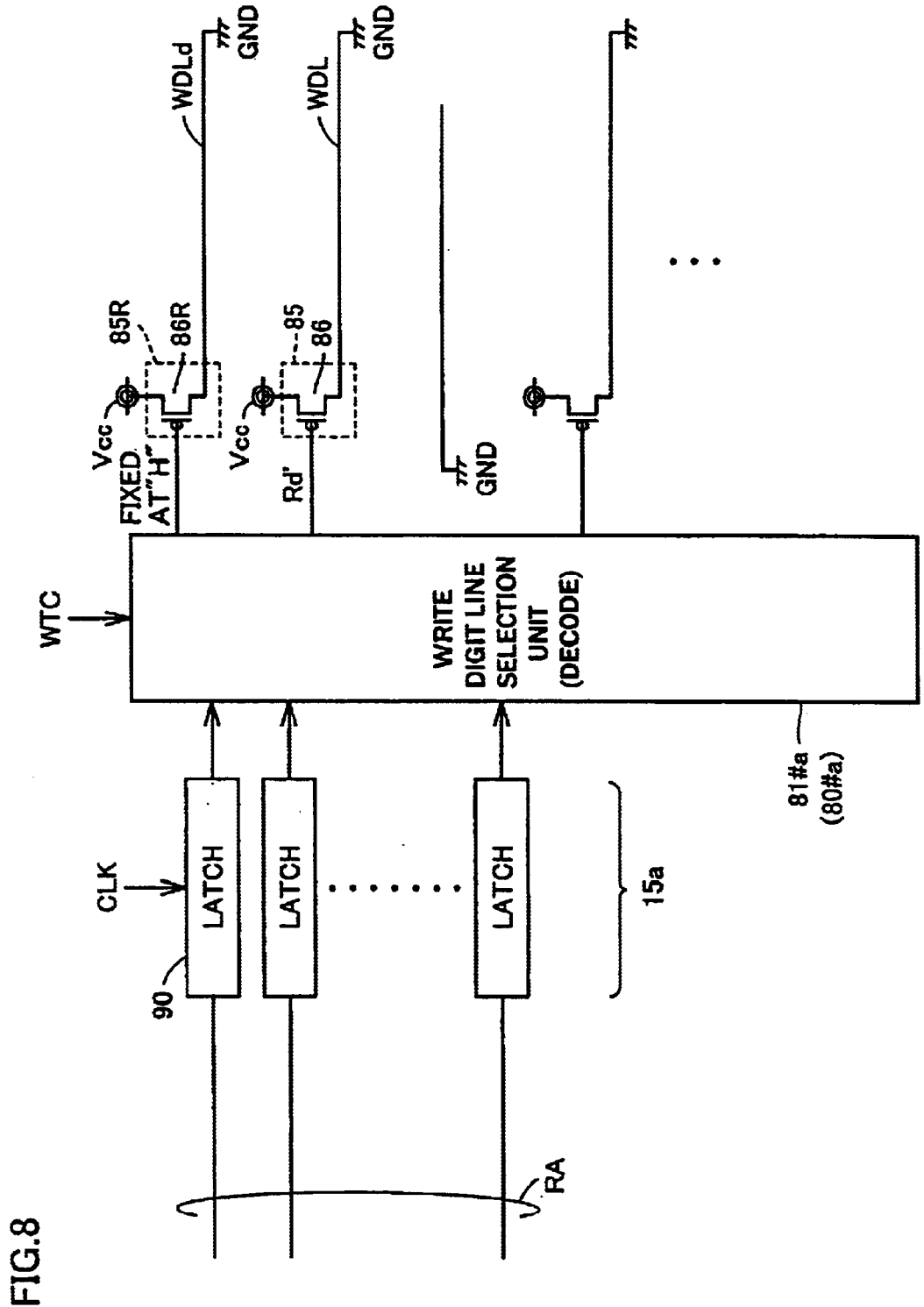
FIG. 8 is a circuit diagram showing a configuration of components of a row selection circuit that are related to selection of write digit lines.

FIG. 8 is a circuit diagram showing a configuration of components of a row selection circuit that are related to selection of write digit lines.

Referring to FIG. 8, address latch circuit 15a is shared by word line selection unit 81a and a write digit line selection unit 81#a. Write digit line selection unit 81#a decodes each bit of row address RA held by address latch circuit 15a to generate a decode signal Rd'.

In data writing, decode signal Rd' is activated to L level in a selected memory cell row in a selected memory cell block and inactivated to H level in other memory cell rows except for the selected memory cell row.

Write digit line driver 85 includes a P channel MOS transistor 86 connected between supply voltage Vcc and one end of a corresponding write digit line WDL. The other end of write digit line WDL is connected to ground voltage GND. Transistor 86 has the gate receiving corresponding decode signal Rd'. Therefore, in the selected memory cell row, transistor 86 is turned on to flow a data write current in the direction from write digit line driver 85 toward ground voltage GND. On the other hand, in the remaining memory cell rows, transistors 86 are turned off and no data write current flows in write digit lines WDL. The data write current flowing through write digit line WDL generates a magnetic field in the direction of the hard axis in each MTJ memory cell MC.

In addition, a write digit line driver 85R is provided correspondingly to the reference cell row. As discussed above, it is unnecessary to write data in reference cells RMC in a normal operation. Therefore, a dummy write digit line WDLd and write digit line driver 85R may be dispensed with. However, in order to ensure continuity of the shape in the memory cell blocks and peripheral regions thereof to facilitate the manufacturing process, dummy write digit line WDLd and write digit line driver 85R having the same configuration as that of write digit line driver 85 are provided as shape dummies.

Write digit line driver 85R includes a P channel MOS transistor 86R connected between supply voltage Vcc and one end of write digit line WDLd. The gate voltage of transistor 86R is fixed at H level by write digit line selection unit 81#a and thus transistor 86R stays in OFF state.

In addition, a digit line selection unit 80#a and digit line drivers 85 corresponding to odd-numbered rows have the same configuration and functions as those of digit line selection unit 81#a and digit line drivers 85 corresponding to even-numbered rows.

Referring again to FIG. 7, in data writing, selector circuits 25a and 25b, write driver control circuit 30 and data buffer 60 are used. Write driver control circuit 30 includes a data latch circuit 32 for temporarily holding input data DIN of L bits transmitted from the data input buffer, and a write driver decoder 31 generating write control signals WTa0, WTa1, WTb0 and WTb1 based on the data held by data latch circuit 32.

Figure 9:
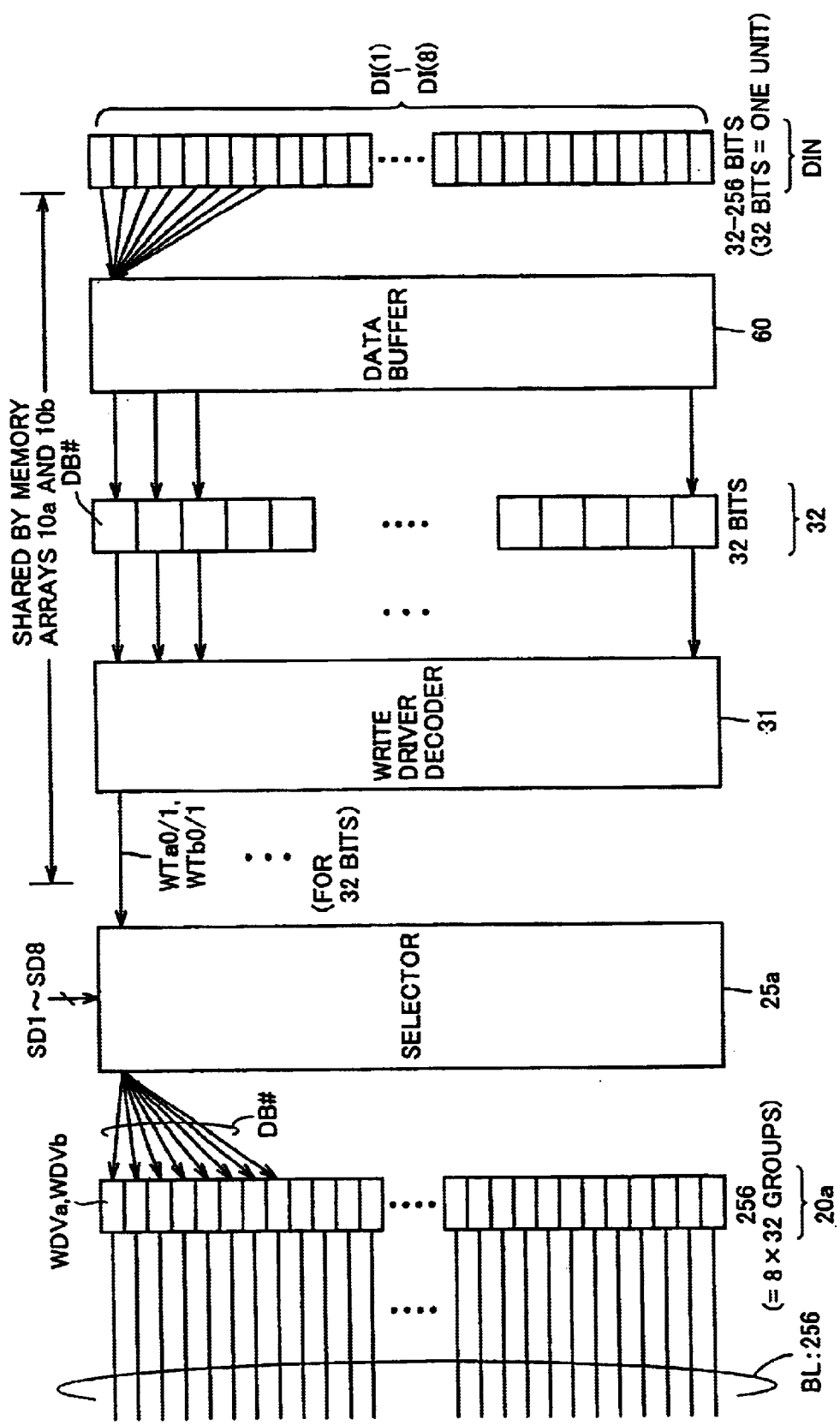
FIG. 9 is a block diagram illustrating an operation of peripheral circuitry in data writing.

FIG. 9 is a block diagram illustrating an operation of the peripheral circuitry in data writing.

Referring to FIG. 9, it is supposed here that memory cell blocks 5a and 5b each have 256 memory cell columns, i.e., 256 bit lines. Input data DIN in one data writing operation ranges from 32 bits to 256 bits, with 32 bits composing one data unit. As described above, in order to write data into MTJ memory cells, current has to be supplied for generating a magnetic field of a predetermined level or higher. There is thus a limitation to the number of MTJ memory cells into which data can be written in parallel. Therefore, for the MRAM device of this embodiment, the number of bits that can be written simultaneously in parallel is M (M is an integer which is a divisor of L and satisfies a relation: $2 \leq M \leq L$). Here, M is 32 (M=32).

If input data DIN in one data writing operation has 256 bits (the number of bits L=256), that one data writing operation is divided into 8 unit operations (L/M=8) each for writing one unit (M bits) of data bits. More specifically, input data DIN is divided into write data DI(1)–DI(8) each formed of 32 bits that are written in parallel in each of the 8 unit operations.

Data buffer 60 temporality holds input data DIN of L bits (256 bits) in one data writing operation. In each unit operation, input data DIN held in data buffer 60 is transferred to data latch circuit 32, one data-bit unit at a time, i.e., 32 bits (M bits) at a time. Data latch circuit 32 temporarily holds write data of M bits (32 bits) that is a part of input data DIN. Here, the leading bit of the 32-bit write data held in data latch circuit 32 is indicated particularly by DB#.

In each unit operation, write driver decoder 31 receives 32-bit write data held in data latch circuit 32 to generate 32 (M) sets of write control signals WTa0, WTa1, WTb0 and WTb1 for writing the write data. Write control signals WTa0, WTa1, WTb0 and WTb1 generated by write driver decoder 31 are transmitted to selector circuit 25a associated with a selected memory cell block 5a.

In each of memory cell blocks 5a and 5b, 256 bit line drivers WDVa/WDVb corresponding respectively to the 256 bit lines are divided into M (32) groups. Each group is accordingly constituted of 8 (sets of) bit line drivers WDVa and WDVb corresponding respectively to 8 (256/32) bit lines.

According to selector control signals SD1–SD8 for selecting one out of eight data bits (8:1) in each group, selector circuit 25a selectively transmits write control signals WTa0, WTa1, WTb0 and WTb1 to bit line drivers WDVa and WDVb. For example, according to selector control signals SD1–SD8, write control signals WTa0, WTa1, WTb0 and WTb1 corresponding to the leading bit DB# of the write data are transmitted to one of 8 bit line drivers WDVa and one of 8 bit line drivers WDVb constituting the leading group.

FIG. 10 is a circuit diagram showing details of the configuration related to transmission of the write control signals to the bit line drivers.

Referring to FIG. 10, bit line driver WDVa includes driver transistors 91 and 92 connected respectively between one end of bit line BL and supply voltage Vcc and between that one end of bit line BL and ground voltage GND. Driver transistors 91 and 92 corresponding to a selected bit line have respective gates receiving write control signals WTa1 and WTa0 respectively via selectors 101 and 102. Bit line driver WDVb includes driver transistors 93 and 94 connected respectively between the other end of bit line BL and supply voltage Vcc and between the other end of bit line BL and ground voltage GND. Driver transistors 93 and 94 connected to a selected bit line have respective gates receiving write control signals WTb1 and WTb0 respectively via selectors 103 and 104. Driver transistors 91 and 93 are constituted of P channel MOS transistors while driver transistors 92 and 94 are constituted of N channel MOS transistors.

Accordingly, bit line driver WDVa corresponding to the selected bit line drives one end of the selected bit line with one of supply voltage Vcc and ground voltage GND according to write control signals WTa0 and WTa1. On the other hand, bit line driver WDVb corresponding to the selected bit line drives the other end of the selected bit line with the other of supply voltage Vcc and ground voltage according to write control signals WTb0 and WTb1.

As discussed in connection with FIG. 9, write driver decoder 31 generates 32 sets of write control signals WTa0, WTa1, WTb0 and WTb1 according to each of 32 bits of the write data temporarily held in data latch circuit 32.

If a corresponding bit of the write data is "1," write control signals WTa1 and WTa0 are set at L level while write control signals WTb1 and WTb0 are set at H level. Then, driver transistors 91 and 94 are turned on while driver transistors 92 and 93 are turned off. Data write current +Iw thus flows through the bit line from bit line driver WDVa toward bit line driver WDVb. If a corresponding bit of the write data is "0," write control signals WTa1 and WTa0 are set at H level while write control signals WTb1 and WTb0 are set at L level. Driver transistors 92 and 93 are thus turned on while driver transistors 91 and 94 are turned off. Accordingly, data write current −Iw flows through the bit line from bit line driver WDVb toward bit line driver WDVa.

The data write current flowing though bit line BL generates a magnetic field in the direction of the easy axis in MTJ memory cell. Into the MTJ memory cell with corresponding write digit line WDL and bit line BL both flowing the data write current therethrough, write data is magnetically written according to the direction of data write current (+Iw, −Iw) flowing through the bit line. For bit line BL in each memory cell column, a configuration similar to that above is provided.

A selector decoder 26 generates selector control signals SD1–SD8 based on the result of decoding of column address CA latched by column decode circuit 16 as well as control signal CBI defining a bit line current supply period in which the bit line current is supplied in the data writing operation. Selector control signals SD1–SD8 may hereinafter be denoted simply by selector control signal SD. According to column address CA, selector decoder 26 activates one of selector control signals SD1–SD8 to H level for the bit line current supply period. Other selector control signals in the bit line current supply period and each selector control signal SD in a period other than the bit line current period are set at L level.

Write control signals WTa0, WTa1, WTb0 and WTb1 generated independently for each of the 32 groups are provided commonly to bit line drivers WDVa and WDVb in the same group. In each memory cell column, write control signals WTa0, WTa1, WTb0 and WTb1 are transmitted to respective gates of driver transistors 91–94 via respective selectors 101–104. Selectors 101–104 related to the same bit line drivers receive common selector control signal SD. For example, selectors 101–104 related to the bit line drivers in the top memory cell column shown in FIG. 10 each receive selector control signal SD1, and selectors 101–104 in the subsequent memory cell column each receive selector control signal SD2.

When the corresponding selector control signal SD is activated to H level, selectors 101–104 transmit write control signals WTa0, WTa1, WTb0 and WTb1 to respective gates of corresponding driver transistors 91–94. Then, in the bit line current supply period in data writing, data write current +Iw or −Iw flows through the selected bit line in the direction according to write control signals WTa1, WTa0, WTb0 and WTb1 in the bit line current supply period in data writing.

Accordingly, one set of bit line drivers in each group that are selected by selector control signals SD1–SD8 are used for writing data. In other words, one unit operation is carried out by writing 32 data bits in parallel.

When the corresponding selector control signal SD is inactivated to L level, outputs from selectors 101 and 102 are fixed at H level and outputs from selectors 103 and 104 are fixed at L level. Then, each bit line in any period other than the bit line current supply period and each non-selected bit line in the bit line current supply period are in the floating state since corresponding driver transistors 91–94 are turned off.

Figure 11:
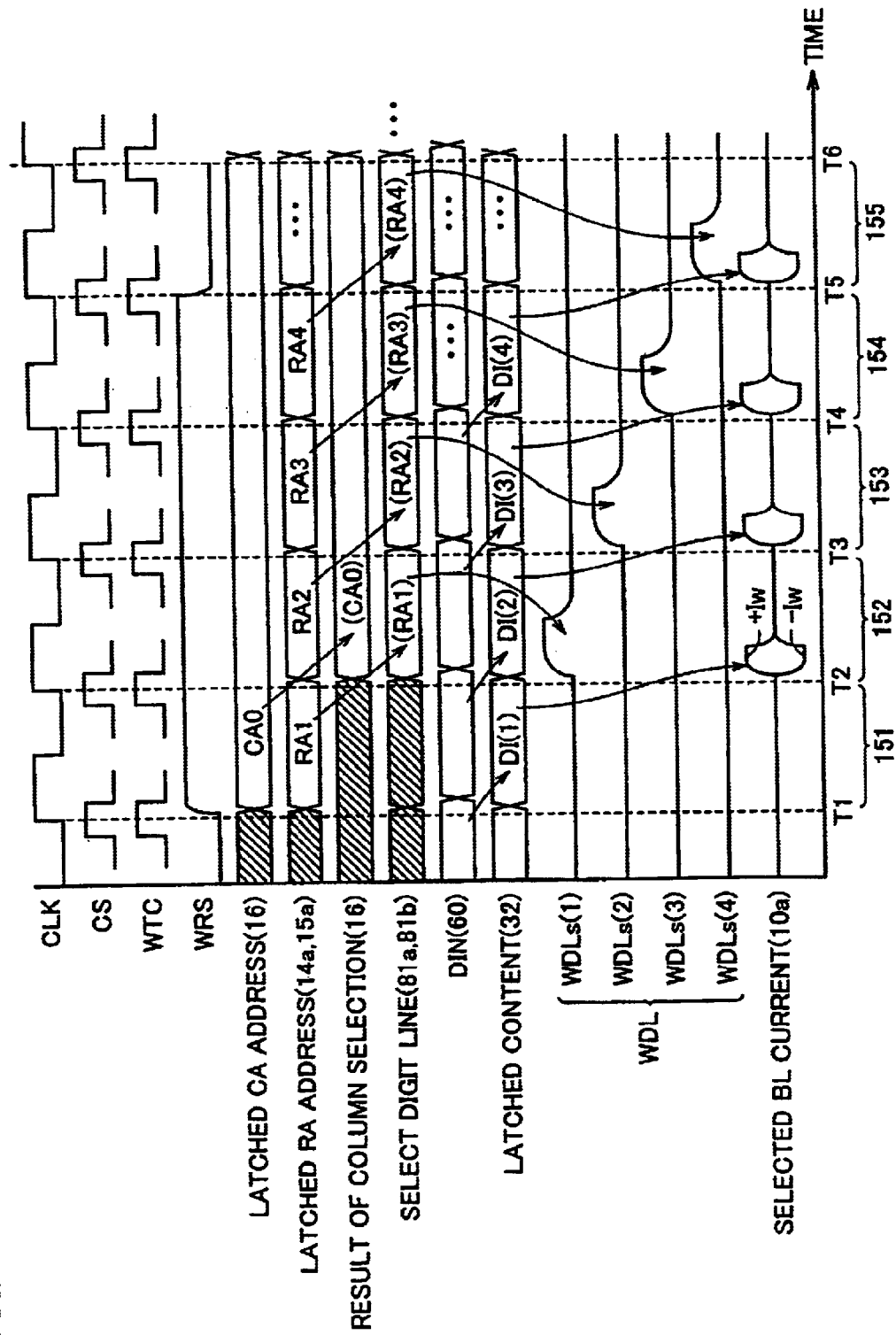
FIG. 11 is an operational waveform chart illustrating an operation of writing data by the MRAM device according to the first embodiment.

FIG. 11 is an operational waveform chart illustrating the data writing operation by the MRAM device according to the first embodiment.

Referring to FIG. 11, activation edges of clock signal CLK are indicated respectively by time T1–time T6 and corresponding signal cycles are indicated by cycle 151–155, . . . as shown in FIG. 6. At time T1, a write command is input to set write control signal WRS to H level and, at time T1–time T4 corresponding to the clock activation edge, read clock WTC is activated to H level.

As described above, if L is equal to 256 (L=256 bits), one data writing operation is composed of 8 unit operations respectively for writing write data DI(1)–DI(8) each being composed of 32 bits. In FIG. 11, however, initial four unit operations are exemplarily shown.

The data writing operation by peripheral circuitry 10 is also divided into a plurality of stages according to the cycles of clock signal CLK and carried out in pipelining manner as discussed below.

At time T1, in response to write clock WTC, row address RA1 and column address CA0 are latched by address latch circuits 14a and 15a and column decode circuit 16.

In cycle 151, according to the latched addresses at time T1, row selection and column selection are carried out. Specifically, decoding by word line selection units 80a and 81a and column decode circuit 16 as shown in FIG. 3 is performed. Write data DI(1) of 32 bits corresponding to leading 32 bits of input data DIN is separated, transferred and latched by data latch circuit 32 shown in FIGS. 7 and 9 for writing the initial unit operation.

In cycle 151, voltage generating circuit 95 shown in FIG. 7 generates supply voltage Vcc by boosting or pumping. Further, write driver decoder 31 as shown in FIGS. 7 and 9 generates 32 sets of write control signals WTa1, WTa0, WTb0 and WTb1 for initial unit operation based on the write data latched by data latch circuit 32. In this way, preparation is done for actually supplying data write current in the subsequent cycle 152.

In the following cycle 152 (from time T2 to time T3), write digit line WDLs(1) corresponding to row address RA1 latched at time T1 is activated. Selector circuit 25a related to selected memory cell block 5a transmits, according to selector control signals from selector decoder 26 shown in FIG. 10, 32 sets of write control signals WTa1, WTa0, WTb0 and WTb1 to bit line drivers WDVa and WDVb corresponding to the selected 32 bit lines.

Accordingly, through the selected (one) write digit line as well as the selected (32) bit lines, data write current flows for writing write data DI(1). The initial unit operation corresponding to write data DI(1) is thus written.

Column address CA is fixed (CA=CA0) in the data writing operation as well. On the other hand, row address RA is updated in each cycle in burst operation manner. Then, at time T2 when cycle 152 starts, row address RA2 is newly latched by address latch circuits 14a and 15a and row selection corresponding to row address RA2 is performed in cycle 152. In addition, at time T2, 32-bit write data DI(2) corresponding to the subsequent 32 bits of input data DIN is separately transferred to and latched by data latch circuit 32.

As discussed above, one data writing operation is divided into a plurality of unit operations, and a part of the bits of input data DIN are written in parallel in each unit operation. The stage of writing the data unit is further divided into first and second stages corresponding respectively to cycles 151 and 152 and carried out in pipelining manner. In the first stage (cycle 151), no array operation is substantially performed while the address information is taken, the input data is divided and separately transferred and preparation is done for supplying the data write current. In the second stage (cycle 152), by bit line driver circuits corresponding to the activated selected word line and selected bit line, the data write current is actually supplied.

In cycle 152, in parallel with the operation of the second stage as described above for row address RA1, the operation of the first stage is performed for the next row address RA2.

In cycle 153 and subsequent cycles, similar pipelining operation is carried out. Then, in cycle 153 and cycle 154, row addresses RA3 and RA4 are taken in respectively, and write data DI(3) and write data DI(4) are separately transferred to and latched by data latch circuit 32. In cycle 153, preparation is done for supplying the data write current for write data DI(3) and, in cycle 154, preparation is done for supplying the data write current for write data DI(4).

Accordingly, in cycles 153–155, write digit lines WDLs (2)–WDLs(4) respectively corresponding to row addresses RA2–RA4 are activated to write the write data DI(2)–DI(4) corresponding respectively to row addresses RA2–RA4 taken in respective cycles 152–154.

In peripheral circuitry 10, connection of bit lines are selected by selector circuits 25a and 25b to efficiently input the multibit write data in the direction of column (bit lines) as described above.

Moreover, even if input data for one writing operation is constituted of a large number of bits, the input data is divided into a plurality of unit operations so that the number of bits actually written in parallel simultaneously is reduced. Therefore, increase of the peak power consumption caused by increased data write current is prevented. In addition, as the data writing operation in peripheral circuitry 10 is divided into a plurality of stages and performed in pipelining manner, fast data writing operation is possible by high frequency process in response to clock signal CLK. In particular, in the first cycle (cycle 151 in FIG. 11) before a selected address is determined, supply voltage Vcc for the data-writing circuitry is generated and thus the fast data writing operation is achieved.

Second Embodiment

According to a second embodiment, a structure of an OUM cell is described that is applicable to the nonvolatile memory device of the first embodiment instead of the MTJ memory cell.

Figure 12:
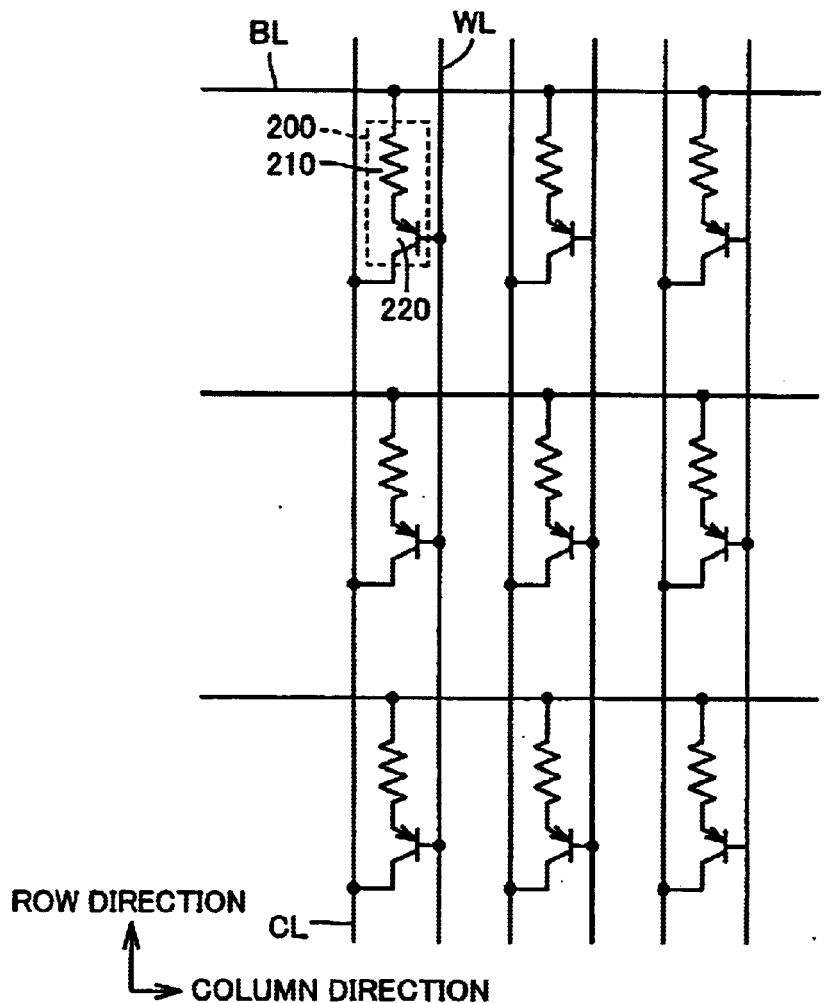
FIG. 12 is a circuit diagram showing a configuration of a memory cell block according to a second embodiment.

FIG. 12 is a circuit diagram showing a configuration of a memory cell block formed by OUM cells according to the second embodiment.

Referring to FIG. 12, memory cell block 5# includes OUM cells 200 arranged in rows and columns. Word lines WL and collector lines CL are arranged correspondingly to respective rows of OUM cells 200 and bit lines BL are arranged correspondingly to respective columns of OUM cells 200. OUM cells 200 each include a chalcogenide layer 210 which is a phase-changing element and a switching transistor 220 that are connected in series between a corresponding bit line and a corresponding collector line. The gate of switching transistor 220 is connected to word line WL and the collector thereof is connected to collector line CL.

Figure 13:
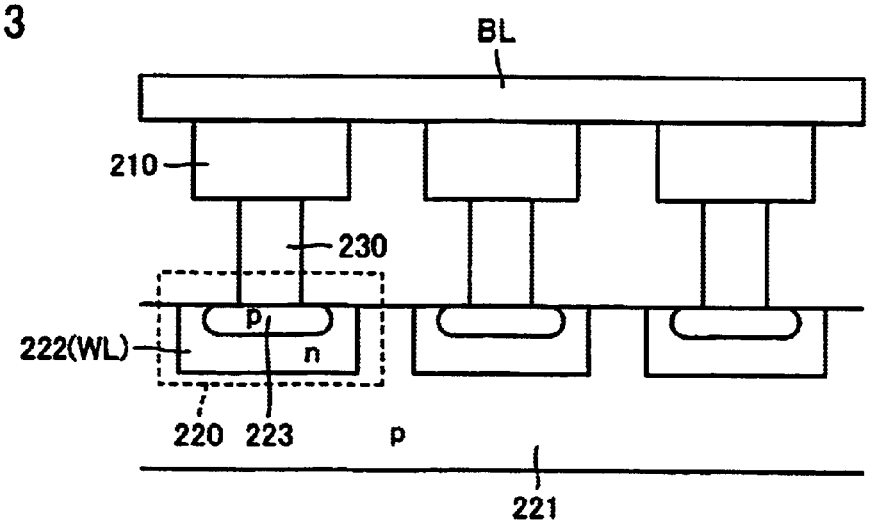
FIG. 13 is a cross sectional view showing a structure of an OUM cell shown in FIG. 12.

Referring to FIG. 13, switching transistor 220 includes an n-type region 222 formed on a p-type region 221 and a p-type region 223 formed within n-type region 222. Switching transistor 220 is thus formed of a parasitic bipolar transistor of vertical pnp, i.e., p-type region 221, n-type region 222 and p-type region 223.

N-type region 222 corresponds to word line WL shown in FIG. 12. Between chalcogenide layer 210 and switching transistor 220, a heater element 230 generating heat by current passed therethrough is provided. In data writing, switching transistor 220 is turned on and a data write current is supplied from bit line BL to pass chalcogenide layer 210 and heater element 230. Depending on the supply pattern of the data write current (e.g. the time period for supplying the current and the amount of the supplied current), chalcogenide layer 210 is converted into a crystalline state or amorphous state. The electric resistance of chalcogenide layer 210 is different between amorphous state and crystalline state. Specifically, the chalcogenide layer in the amorphous state has a higher electric resistance than that in the crystalline state.

Therefore, in order to read data, switching transistor 220 is turned on to pass, through chalcogenide layer 210, a data read current of a level which does not cause the phase change. Data is thus read based on the difference in electric resistance as done by MTJ memory cells.

Thus, the configuration of the bit line drivers in write drivers 20a and 20b may be changed to those appropriate for OUM cells. Then, memory cell block 5# of OUM cells shown in FIG. 12 may be employed instead of MTJ memory cells MC of the MRAM device 1 shown in FIG. 1 to allow multibit data to be input/output in parallel by a similar peripheral circuitry configuration in a similar manner. In this way, a nonvolatile memory device of OUM cells provides the configuration of peripheral circuitry suitable for fast parallel input/output of multibit data.

Although the MRAM device (nonvolatile memory device) of the above-discussed embodiments has the configuration including two memory cell blocks that are selectively accessed, the application of the present invention is not limited to such a configuration. In other words, a configuration having an arbitrary number (at least three) of memory cell blocks may be provided or a configuration having one memory cell block without selection of memory cell block may be provided to which a peripheral circuitry configuration similar to that described above is applicable between selector circuits and data nodes.

The embodiments of the present invention provide a configuration as described above having reference cells RMC with their structure and characteristics similar to those of MTJ memory cells. The present invention is not limited to such reference cells and is applicable to reference cells designed to have characteristics different from those of MTJ memory cells.

For example, the present invention is also applicable to a configuration including, for MTJ memory cells, reference cells RMC designed in advance to have an electric resistance intermediate between two electric resistances Rmax and Rmin of normal memory cells MC, preferably Rref=(Rmax+Rmin)/2.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile memory device comprising:

a plurality of memory cell blocks that are selectively accessed, said memory cell blocks each including a plurality of memory cells arranged in a matrix and each having an electric resistance varying according to storage data written in nonvolatile manner by a data write current and a plurality of bit lines respectively provided correspondingly to memory cell columns;

a plurality of row selection circuits respectively provided correspondingly to said plurality of memory cell blocks, said row selection circuits each selecting memory cell rows in a corresponding memory cell block; and peripheral circuitry for writing and reading data of multiple bits in parallel, said data being input/output to/from a data node, into and from at least a part of memory cells in the selected memory cell row, through at least a part of said plurality of bit lines in a selected memory cell block which is one of said plurality of memory cell blocks, said peripheral circuitry transmitting said data of multiple bits in the direction of said memory cell columns.

2. The nonvolatile memory device according to claim 1, wherein said peripheral circuitry includes a plurality of write drivers respectively provided correspondingly to said plurality of memory cell blocks, said plurality of write drivers each include a plurality of bit line drivers respectively provided correspondingly to said plurality of bit lines in a corresponding memory cell block, said plurality of bit line drivers each control supply of said data write current to a corresponding bit line, in a data reading operation, said row selection circuits electrically couple memory cells in the selected memory cell row respectively to said plurality of bit lines in said selected memory cell block, said peripheral circuitry includes a plurality of sense amplifiers each supplying a data read current to at least one of said plurality of bit lines that is connected to said sense amplifier supplying said data read current and reading data based on said data read current and a plurality of selector circuits respectively provided correspondingly to said plurality of memory cell blocks, and in said data reading operation, that one of said plurality of selector circuits that corresponds to said selected memory cell block selectively connects at least a part of said plurality of bit lines in said selected memory cell block to said plurality of sense amplifiers and, in a data writing operation, said one of said plurality of selector circuits selectively transmits said data of multiple bits that is input to said data node to a part of said plurality of bit line drivers in said selected memory cell block.

3. The nonvolatile memory device according to claim 2, wherein said plurality of memory cell blocks each further include a plurality of reference cells to be compared with said plurality of memory cells in said data reading operation, in one non-selected memory cell block which is one of said plurality of memory cell blocks, said plurality of bit lines are electrically coupled respectively to said plurality of reference cells, and said selector circuits connect each of said plurality of sense amplifiers to one of said plurality of bit lines in said selected memory cell block and to one of said plurality of bit lines in said one non-selected memory cell block.

4. The nonvolatile memory device according to claim 1, further comprising an address latch circuit temporarily holding information for selecting said memory cell rows and memory cell columns, and said peripheral circuitry includes a data latch circuit temporarily holding said data of multiple bits transmitted between said selected memory cell block and said data node and divides a data reading operation and a data writing operation each into a plurality of cycles to carry out said cycles in pipelining manner.

5. A nonvolatile memory device comprising:

a plurality of memory cells arranged in a matrix and each having an electric resistance varying according to storage data written in nonvolatile manner by a data write current;

an address latch circuit temporarily holding information for selecting memory cell rows and memory cell columns;

a plurality of bit lines respectively provided correspondingly to said columns of said memory cells;

a row selection circuit selecting the memory cell rows according to the information held by said address latch circuit; and peripheral circuitry for writing and reading data of multiple bits in parallel, said data being input/output to/from a data node, into and from selected memory cells which are at least a part of memory cells in a selected memory cell row, through at least a part of said plurality of bit lines, said peripheral circuitry including a data latch circuit temporarily holding said data of multiple bits transmitted between said selected memory cells and said data node, and dividing a data reading operation and a data writing operation each into a plurality of cycles to carry out said cycles in pipelining manner.

6. The nonvolatile memory device according to claim 5, wherein said plurality of cycles are carried out successively in synchronization with a clock signal having a predetermined frequency.

7. The nonvolatile memory device according to claim 5, wherein said peripheral circuitry includes a plurality of sense amplifiers each supplying a data read current to one of said plurality of bit lines that is connected to said sense amplifier supplying said data read current and carrying out a data reading operation based on said data read current and a selector circuit selectively connecting, in said data reading operation, at least a part of said plurality of bit lines to said plurality of sense amplifiers according to the information held by said address latch circuit, said row selection circuit electrically couples, in said data reading operation, memory cells of said selected memory cell row respectively to said plurality of bit lines, said plurality of cycles include a first cycle for setting said plurality of bit lines each at a predetermined voltage different from a voltage before said data reading operation and a second cycle carried out after said first cycle, and in said second cycle, said row selection circuit electrically couples the memory cells of said selected memory cell row respectively to said plurality of bit lines.

8. The nonvolatile memory device according to claim 7, further comprising a plurality of reference cells to be compared with said plurality of memory cells in said data reading operation, and in said first cycle, said plurality of bit lines electrically coupled to said plurality of reference cells are each supplied with said data read current.

9. The nonvolatile memory device according to claim 7, wherein said plurality of cycles further include a third cycle carried out after said second cycle, and in said third cycle, said row selection circuit selects another memory cell row different from the memory cell row in said second cycle to electrically couple memory cells of said another memory cell row respectively to said plurality of bit lines.

10. The nonvolatile memory device according to claim 5, wherein said peripheral circuitry further includes a plurality of bit line drivers respectively provided correspondingly to said plurality of bit lines and each controlling supply of said data write current to a corresponding bit line and a selector circuit transmitting, in said data writing operation, said data of multiple bits input to said data node to a part of said bit line drivers that is selected according to the information held by said address latch circuit, said plurality of cycles include a first cycle for preparing supply of said data write current by said plurality of bit line drivers and a second cycle carried out after said first cycle, and in said second cycle, the bit line drivers selected by said selector circuit supply said data write current to respective corresponding bit lines.

11. The nonvolatile memory device according to claim 10, wherein said plurality of cycles further include a third cycle carried out after said second cycle, and in said third cycle, a memory cell row different from that in said second cycle being selected by said row selection circuit, the bit line drivers selected by said selector circuit supply said data write current to respective corresponding bit lines.

12. The nonvolatile memory device according to claim 5, wherein said data write current has a direction according to level of data to be written, and said plurality of memory cells each include a first magnetic layer having a fixed magnetization direction, a second magnetic layer magnetized in a direction according to a magnetic field generated by said data write current and an insulating film formed between said first and second magnetic layers.

13. The nonvolatile memory device according to claim 5, wherein an application pattern for applying said data write current is controlled according to level of data to be written, and said plurality of memory cells each include a heater element generating heat by said data write current and a phase-changing element heated by said heater element to be converted into one of two phase states according to said application pattern of said data write current.

14. A nonvolatile memory device comprising:

a plurality of memory cells arranged in a matrix and each having an electric resistance varying according to storage data written in nonvolatile manner by a data write current;

a row selection circuit for selecting memory cell rows;

a plurality of bit lines respectively provided correspondingly to memory cell columns; and peripheral circuitry for writing, through said plurality of bit lines, input data of L bits in one data writing operation, L being an integer of at least 2, into L memory cells selected from said plurality of memory cells, said peripheral circuitry including a data latch circuit for temporarily holding said input data of L bits, and in said one data writing operation, said peripheral circuitry carrying out unit operations of (L/M) times, in each of said operations M bits of said input data of L bits written in parallel into M memory cells, M being a divisor of L and satisfying a relation $2 \leq M \leq L$, the M memory cells in respective unit operations being different from each other.

15. The nonvolatile memory device according to claim 14, wherein said peripheral circuitry includes a plurality of bit line drivers respectively provided correspondingly to said plurality of bit lines and each controlling supply of said data write current to a corresponding bit line, a selector circuit for selecting M bit line drivers from said plurality of bit line drivers in each of said unit operations and a driver control circuit instructing, in each of said unit operations, said M bit line drivers selected by said selector circuit to supply said data write current having a property corresponding to each of said M bits of the input data held by said data latch circuit.

16. The nonvolatile memory device according to claim 15, wherein said plurality of bit line drivers are divided into M groups, said driver control circuit includes a write decode circuit generating, in each of said unit operations, M sets of write control signals based on said M bits of the input data held by said data latch circuit, and said selector circuit selects M bit line drivers respectively from said M groups and transmits said M sets of write control signals from said write decode circuit in parallel to the selected M bit line drivers.

17. The nonvolatile memory device according to claim 15, wherein said row selection circuit selects a different memory cell row in each of said unit operations, and in said one data writing operation, selection of said M bit line drivers by said driver control circuit is fixed.

* * * * *